United States Patent
Palaniappa et al.

(10) Patent No.: US 6,877,993 B2
(45) Date of Patent: Apr. 12, 2005

(54) PACKAGED DEVICE ADAPTER ASSEMBLY WITH ALIGNMENT STRUCTURE AND METHODS REGARDING SAME

(75) Inventors: Ilavarasan Palaniappa, Apple Valley, MN (US); Mickiel Fedde, Eagan, MN (US); Jason Allen Cramer, St. Paul, MN (US)

(73) Assignee: Ironwood Electronics, Inc., Eagan, MN (US)

( * ) Notice: Subject to any disclaimer, the term of this patent is extended or adjusted under 35 U.S.C. 154(b) by 0 days.

(21) Appl. No.: 10/449,542

(22) Filed: May 30, 2003

(65) Prior Publication Data

US 2004/0242030 A1 Dec. 2, 2004

(51) Int. Cl.[7] .............................................. H01R 12/00
(52) U.S. Cl. .......................... 439/73; 439/70; 439/526
(58) Field of Search ............................ 439/83, 70–74, 439/91, 178, 876, 591, 331, 630, 68, 525, 526

(56) References Cited

U.S. PATENT DOCUMENTS

| | | |
|---|---|---|
| 2,578,288 A | 12/1951 | Cook |
| 2,951,817 A | 9/1960 | Myers |
| 3,229,756 A | 1/1966 | Keresztury |
| 3,728,509 A | 4/1973 | Shimojo |
| 3,760,342 A | 9/1973 | Prouty et al. |
| 3,870,385 A | 3/1975 | Avakian et al. |
| 3,971,610 A | 7/1976 | Buchoff et al. |
| 4,295,699 A | 10/1981 | DuRocher |
| 4,345,810 A * | 8/1982 | Bakermans ................. 439/71 |
| 4,460,223 A * | 7/1984 | Brown et al. ................. 439/95 |
| 4,514,784 A | 4/1985 | Williams et al. |
| 4,550,959 A | 11/1985 | Grabbe et al. |
| 4,655,524 A | 4/1987 | Etzel |
| 4,668,957 A | 5/1987 | Spohr |
| 4,678,250 A | 7/1987 | Romine et al. |
| 4,729,166 A | 3/1988 | Lee et al. |
| 4,754,546 A | 7/1988 | Lee et al. |
| 4,862,076 A | 8/1989 | Renner et al. |
| 4,923,739 A | 5/1990 | Jin et al. |
| 5,074,799 A | 12/1991 | Rowlette, Sr. |
| 5,109,320 A | 4/1992 | Bourdelaise et al. |
| 5,123,849 A | 6/1992 | Deak et al. |
| 5,127,837 A | 7/1992 | Shah et al. |
| 5,129,833 A * | 7/1992 | Rowlette, Sr. ............... 439/91 |
| 5,137,462 A | 8/1992 | Casey et al. |
| 5,140,405 A | 8/1992 | King et al. |
| 5,155,661 A | 10/1992 | Nagesh et al. |
| 5,163,837 A | 11/1992 | Rowlette, Sr. |
| 5,286,218 A | 2/1994 | Sakurai et al. |
| 5,313,099 A | 5/1994 | Tata et al. |
| 5,318,456 A | 6/1994 | Mori |
| 5,340,318 A | 8/1994 | Kunihiro |

(Continued)

FOREIGN PATENT DOCUMENTS

| | | |
|---|---|---|
| EP | 0 905 826 A2 | 3/1999 |
| WO | WO 97/16849 | 5/1997 |
| WO | WO 99/66599 | 12/1999 |

OTHER PUBLICATIONS

Herard et al. "Interconnection Technology: Using dendrites to bridge the gaps" *Printed Circuit Fabrication* 1995;18(9)22–24.

(Continued)

*Primary Examiner*—Gary Pauman
*Assistant Examiner*—Edwin A. Leon
(74) *Attorney, Agent, or Firm*—Mueting, Raasch & Gebhardt, P.A.

(57) ABSTRACT

A packaged device adapter assembly for use with high density integrated circuit packages, e.g., micro lead frame packages, micro lead chip carriers, quad flat no lead packages, and micro ball grid array packages, etc., includes an alignment structure for aligning a packaged device therein.

52 Claims, 10 Drawing Sheets

U.S. PATENT DOCUMENTS

| | | | |
|---|---|---|---|
| 5,377,900 A | | 1/1995 | Bergmann |
| 5,387,861 A | | 2/1995 | Neiderhofer |
| 5,389,819 A | | 2/1995 | Matsuoka |
| 5,397,240 A | | 3/1995 | Herard |
| 5,397,245 A | | 3/1995 | Roebuck et al. |
| 5,397,919 A | | 3/1995 | Tata et al. |
| 5,418,471 A | | 5/1995 | Kardos |
| 5,432,679 A | | 7/1995 | Grabbe |
| 5,445,526 A | | 8/1995 | Hoshino et al. |
| 5,468,158 A | | 11/1995 | Roebuck et al. |
| 5,473,510 A | | 12/1995 | Dozier, II |
| 5,477,160 A | | 12/1995 | Love |
| 5,528,462 A | | 6/1996 | Pendse |
| 5,548,223 A | | 8/1996 | Cole et al. |
| 5,566,052 A | | 10/1996 | Hughes |
| 5,636,996 A | | 6/1997 | Johnson et al. |
| 5,662,163 A | | 9/1997 | Mira |
| 5,667,870 A | | 9/1997 | McCullough |
| 5,691,041 A | | 11/1997 | Frankeny et al. |
| 5,699,227 A | | 12/1997 | Kolman et al. |
| 5,710,459 A | | 1/1998 | Teng et al. |
| 5,712,768 A | | 1/1998 | Werther |
| 5,730,620 A | | 3/1998 | Chan et al. |
| 5,735,698 A | | 4/1998 | Bakker et al. |
| 5,741,141 A | | 4/1998 | O'Malley |
| 5,742,481 A | | 4/1998 | Murphy et al. |
| 5,745,346 A | | 4/1998 | Ogawa et al. |
| 5,766,022 A | | 6/1998 | Chapin et al. |
| 5,770,891 A | | 6/1998 | Frankeny et al. |
| 5,783,461 A | | 7/1998 | Hembree |
| 5,791,914 A | * | 8/1998 | Loranger et al. ............. 439/71 |
| 5,793,618 A | | 8/1998 | Chan et al. |
| 5,805,424 A | | 9/1998 | Purinton |
| 5,810,607 A | | 9/1998 | Shih et al. |
| 5,819,406 A | | 10/1998 | Yoshizawa et al. |
| 5,829,988 A | | 11/1998 | McMillan et al. |
| 5,833,471 A | | 11/1998 | Selna |
| 5,859,538 A | | 1/1999 | Self |
| 5,876,219 A | | 3/1999 | Taylor et al. |
| 5,877,554 A | | 3/1999 | Murphy |
| 5,879,172 A | | 3/1999 | McKenna-Olson et al. |
| 5,892,245 A | | 4/1999 | Hilton |
| 5,893,765 A | | 4/1999 | Farnworth |
| 5,896,037 A | | 4/1999 | Kudla et al. |
| 5,923,176 A | | 7/1999 | Porter et al. |
| 5,973,618 A | * | 10/1999 | Ellis .......................... 340/990 |
| 5,982,635 A | | 11/1999 | Menzies et al. |
| 6,007,348 A | | 12/1999 | Murphy |
| 6,325,280 B1 | | 12/2001 | Murphy |
| 6,351,392 B1 | | 2/2002 | Palanpiappa et al. |
| 6,394,820 B1 | * | 5/2002 | Palaniappa et al. ........... 439/83 |
| 6,533,589 B1 | * | 3/2003 | Palaniappa et al. ........... 439/71 |
| 6,644,981 B2 | * | 11/2003 | Choy .......................... 439/70 |

OTHER PUBLICATIONS

Jarvela R.A. "Module Holder and Actuator" *Technical Disclosure Bulletin* 1974;16(12)3975–3976.

Lau, John H., ed. "A Brief Introduction to Ball Grid Array Technologies" *Ball Grid Array Technology* 1995;pp. xii-i–xvi;1–57.

Application Notes for Surface Mount Assembly of Amkor's Micro LeadFrame(MLF) Packages. Sep. 2002.

Ironwood Electronics, Inc. VLSI Interconnection Specialists Catalog XII (pp. 84, 110) (product on p. 110 available at least as early as Oct. 4, 1998).

Ironwood Electronics, Inc. VLI Interconnection Specialists Product Brochure, Spring 1998. 6 pages.

\* cited by examiner

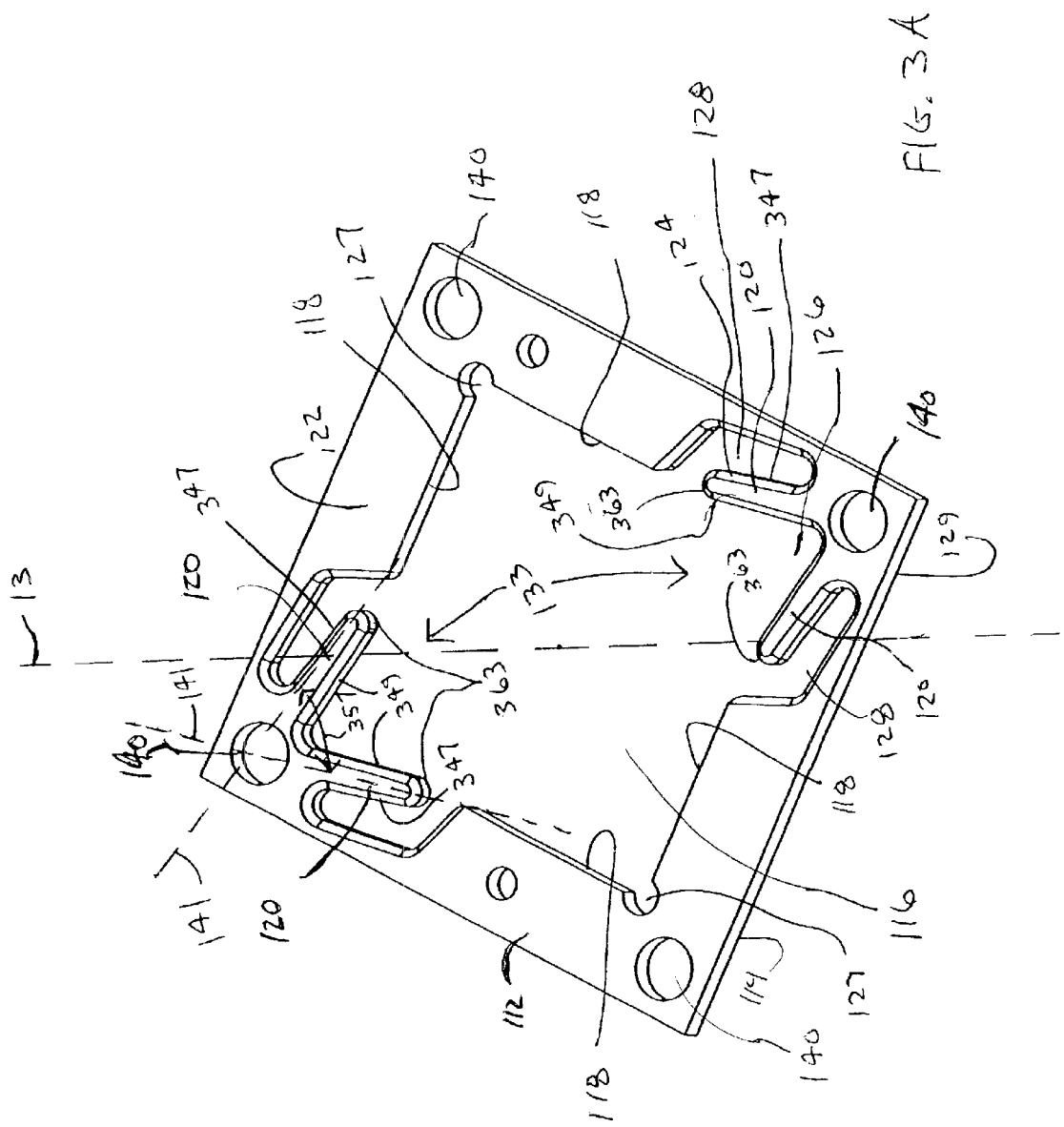

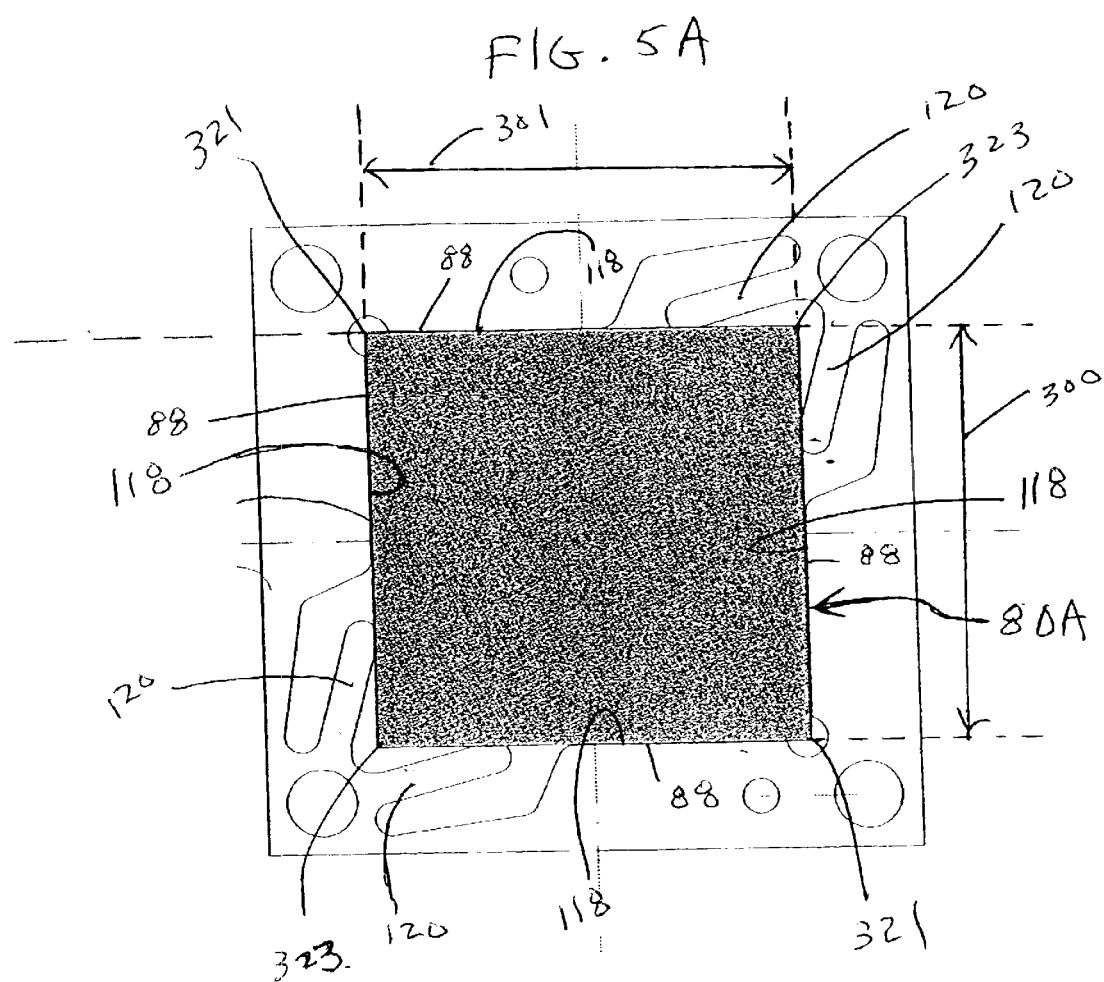

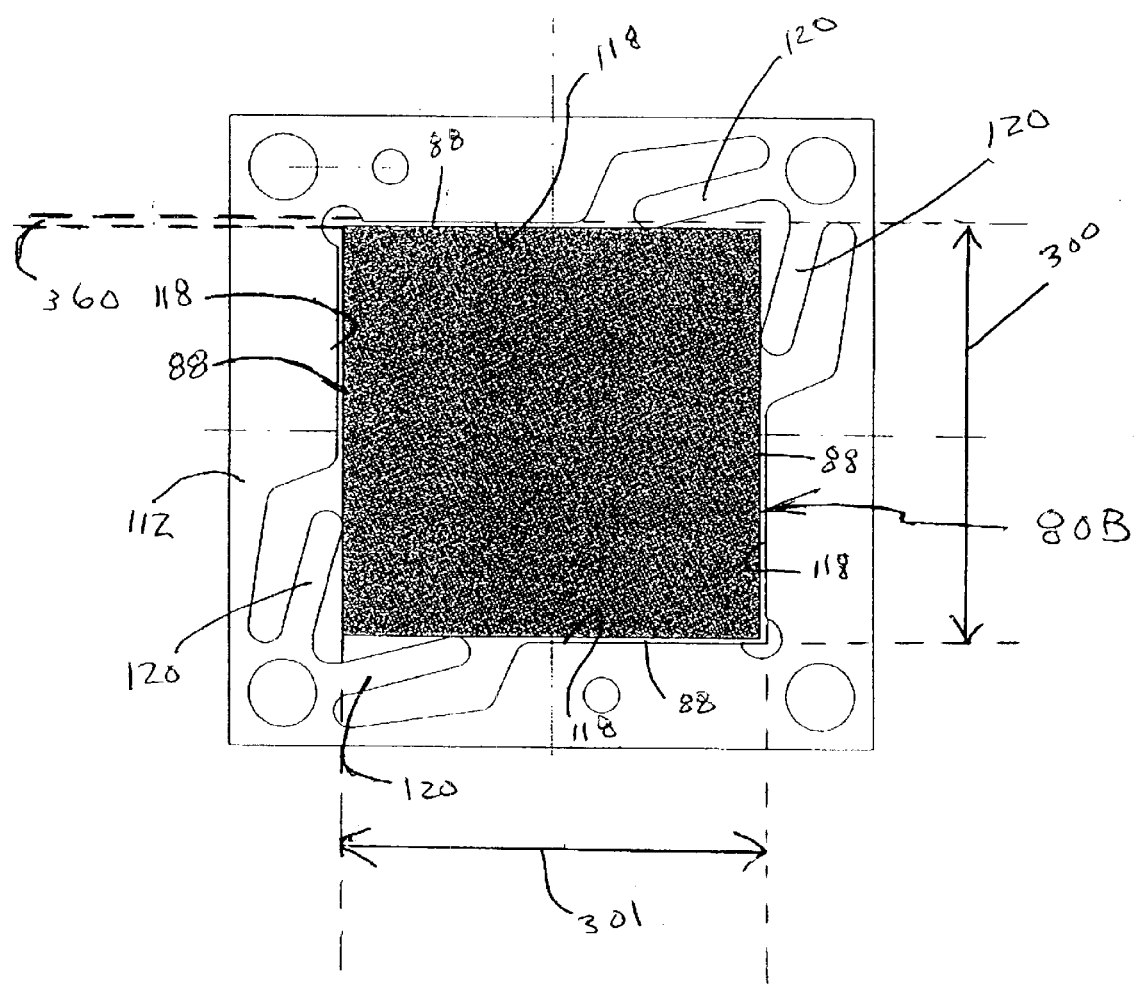

PACKAGED DEVICE ADAPTER ASSEMBLY WITH ALIGNMENT STRUCTURE AND METHODS REGARDING SAME

BACKGROUND OF THE INVENTION

The present invention relates to electrical adapters and methods using such adapters. More particularly, the present invention pertains to adapters for packaged integrated circuit devices, e.g., micro lead frame packages, micro lead chip carriers, quad flat no lead packages, and micro ball grid array packages, etc., and methods for using such adapters.

Certain types of integrated circuit packages are becoming increasingly popular due to their occupancy area efficiency. In other words, they occupy less area on a target board on which they are mounted while providing a high density of contact terminals. For example, one such high density package type is a micro lead frame package. Generally, such packages contain an integrated circuit having its die bond pads electrically connected to respective conductive contact lead elements (e.g., lands) that are distributed on a surface of the package (e.g., the bottom surface of the package, for example, in an array).

A target printed circuit board upon which the package is to be mounted typically has formed on its surface a corresponding array of conductive pads which are aligned with the conductive contact lead elements of the package for electrically mounting the package on the target board. The target board typically includes other conductive traces and elements which lead from the array of conductive pads used for mounting the package to other circuitry on the board for connecting various components mounted thereon.

Typically, to mount such a package to a target board, solder spheres are provided in a manner corresponding to the array of conductive pads on the target board. The package is positioned with the contact lead elements in contact with the solder spheres corresponding to the array of conductive pads on the target board. The resulting structure is then heated until the solder spheres are melted and fused to the contact lead elements of the package.

Such area efficient packaging, e.g., micro lead frame packages or micro ball grid array packages, provide a high density of terminals at a very low cost. Also, this packaging provides for limited lead lengths. The limited lead lengths may reduce the risk of damage to such leads of the package, may provide for higher speed product, etc.

Generally, circuit boards and/or components mounted thereon are tested by designers as the circuit boards are being developed. For example, for a designer to test a circuit board and/or a package mounted thereon, the designer must first electrically connect the package to the target circuit board (e.g., using solder balls).

As described above, this may include mounting the package on the target board and heating the solder spheres to fuse the solder spheres to the contact lead elements of the package. Therefore, the package may be prevented from being used again. It is desirable for various reasons to use package adapters for mounting the packages and reuse such packages after testing. For example, such device packages may be relatively expensive. Further, for example, once attached, the solder spheres are not accessible for testing. In addition, it is often difficult to rework the circuit board with the packages soldered thereon.

Various adapters are available to electrically connect a package to a target printed circuit board without requiring that the contact lead elements on the package be fused to the target board. However, the high density of terminals for certain packages, e.g., micro lead frame packages, lead to various interconnect problems for adapters being used with such packages. For example, alignment of the contact lead elements of the packaged device to the contact pads of the target board is generally problematic when an electrical adapter is used. Such problems may arise from the dimensional differences between device packages (e.g., even if such packages are within manufacturing tolerances).

SUMMARY OF THE INVENTION

The present invention provides packaged device adapter assemblies useable for high density integrated circuit packages, e.g., micro lead frame packages, micro lead chip carriers, quad flat no lead packages, and micro ball grid array packages, etc.

An adapter apparatus according to the present invention for receiving a packaged device is described. The packaged device includes a plurality of contact elements disposed on a surface thereof and one or more perimeter side surfaces defining an outer perimeter of the packaged device. The adapter apparatus includes a perimeter wall member comprising a length along an adapter axis between a first end region of the adapter apparatus and a second end region of the adapter apparatus and a conductive element layer having a plurality of arranged conductive elements. The conductive element layer is positioned at the first end region of the adapter apparatus orthogonal to the adapter axis. The perimeter wall member and the conductive element layer define a socket cavity adapted to receive the packaged device with the plurality of contact elements thereof adjacent the conductive element layer. An alignment structure is positioned at the first end region to align the packaged device within the socket cavity. The alignment structure includes an alignment plate positioned orthogonal to the adapter axis. The alignment plate includes at least one opening defined therein adapted to allow the contact elements of the packaged device to be in electrical contact with the arranged conductive elements of the conductive element layer. Further, the alignment plate includes a plurality of movable elements configured to movably engage the one or more perimeter side surfaces of the packaged device when the packaged device is positioned in the socket cavity adjacent the conductive element layer.

In one embodiment, the plurality of movable elements may include two sets of movable elements configured in opposing relation to one another such that each of the two sets of movable elements are adapted to movably engage at least one of the one or more perimeter side surfaces of the packaged device when the packaged device is received in the socket cavity adjacent the conductive element layer.

In another embodiment, the packaged device is a packaged device having at least two opposing corners with two perimeter side surfaces of the packaged device intersecting at each of the at least two opposing corners. The plurality of movable elements may include two pairs of movable elements configured in opposing relation to one another such that each pair of the two pairs of movable elements movably engage the two perimeter side surfaces that intersect at one of the two opposing corners when the packaged device is received in the socket cavity adjacent the conductive element layer.

In another embodiment, the plurality of movable elements may include one or more surfaces adapted to engage the one or more perimeter side surfaces of the packaged device when the packaged device is positioned in the socket cavity adjacent the conductive element layer. The plurality of movable elements may be adapted to move from a normal state when a packaged device has not been received in the socket cavity to a flex state when the packaged device is positioned in the socket cavity adjacent the conductive element layer. The position of the one or more surfaces of the plurality of movable elements are at a distance further from the adapter axis when the plurality of movable elements are in the flex state as compared to when the plurality of movable elements are in the normal state.

In one or more other embodiments, the plurality of movable elements may have a thickness in the direction of the adapter axis that is less than a thickness of the packaged device; one or more of the plurality of movable elements may include a beveled edge at an upper surface thereof; the plurality of movable elements may be operable to provide opposing forces on the one or more perimeter side surfaces of the packaged device; and/or the conductive element layer may include a conductive elastomer layer.

Yet further, in another embodiment, the alignment plate may include a body portion having one or more fixed inner perimeter surfaces defining the at least one opening. The one or more fixed inner perimeter surfaces define a maximum outer perimeter of the packaged device to be received in the socket cavity. In addition, the body portion may correspond to and may be positioned adjacent an end of the perimeter wall member at the first end region of the adapter apparatus. The plurality of movable elements extend from the body portion of the alignment plate.

In another embodiment, the alignment structure may include a spacer structure that is adapted to define a free space adjacent the plurality of movable elements so as to allow the plurality of movable elements to move from a normal state when the packaged device has not been received in the socket cavity to a flex state when the packaged device is positioned in the socket cavity adjacent the conductive element layer (e.g., a spacer may be used to provide the free space).

In yet another embodiment, the adapter apparatus may include an actuator apparatus that includes a floating member movable in the socket cavity and an actuator element. The actuator element is operable to provide a force on the floating member such that a corresponding force is distributed to the packaged device when received in the socket cavity such that the plurality of contact elements are in electrical contact with the arranged conductive elements of the conductive element layer. The apparatus may also include a cover member positioned at the second end region of the adapter apparatus to close the socket cavity; the cover member being movable to allow the packaged device to be removed from the socket cavity (e.g., a cover member having at least one opening defined therein and also through the floating member to allow access to the packaged device when it is positioned in the socket cavity adjacent the conductive element layer).

The adapter apparatus may be coupled to a target board such that the arranged conductive elements are electrically coupled to contact pads of the target board. Further, the adapter apparatus may be coupled to an interconnect board such that the arranged conductive elements are electrically coupled to contact pads of the interconnect board; the interconnect board being mountable (e.g., surface mountable) to a printed circuit board.

An apparatus for use in an adapter configured to receive a packaged device according to the present invention is also provided. The package device includes a plurality of contact elements disposed on a surface thereof and one or more perimeter side surfaces defining an outer perimeter of the packaged device. The apparatus includes an alignment plate. The alignment plate includes a body portion having one or more fixed inner perimeter surfaces defining an opening about an axis orthogonal to the alignment plate. The one or more fixed inner perimeter surfaces define a maximum outer perimeter of the packaged device. Further, the apparatus includes a plurality of movable elements extending from the body portion of the alignment plate. The plurality of movable elements are configured to movably engage the one or more perimeter side surfaces of the packaged device when the packaged device is positioned in the opening. The alignment plate may be configured as described in one or more of the embodiments described herein with respect to the adapter apparatus.

Yet further, a method of aligning a packaged device in an adapter apparatus is also described. The packaged device includes a plurality of contact elements disposed on a surface thereof and one or more perimeter side surfaces defining an outer perimeter of the packaged device. The method includes providing an adapter apparatus defining a socket cavity for receiving the packaged device. The adapter apparatus includes an alignment plate with the alignment plate including a body portion having one or more fixed inner perimeter surfaces defining an opening about an axis orthogonal to the alignment plate. The alignment plate further includes a plurality of movable elements extending from the body portion thereof. The plurality of movable elements are in a normal state when a packaged device has not been received in the opening. The method further includes positioning the packaged device in the socket cavity such that the plurality of movable elements are moved to a flex state. A position of one or more surfaces of the plurality of movable elements are at a distance further from the axis when the plurality of movable elements are in the flex state as compared to when the plurality of movable elements are in the normal state.

In one embodiment of the method, one or more of the plurality of movable elements include a beveled edge at an upper surface thereof. As such, positioning the packaged device in the socket cavity includes engaging one or more edges of the packaged device with the beveled edge of one or more of the plurality of movable elements forcing the movable elements from the normal state to the flex state.

In another embodiment of the method, the method includes providing, with use of the plurality of movable elements, opposing forces on the one or more perimeter side surfaces of the packaged device when the packaged device is positioned in the opening to hold the packaged device in an aligned position in the socket cavity.

The above summary of the present invention is not intended to describe each embodiment or every implementation of the present invention. Advantages, together with a more complete understanding of the invention, will become apparent and appreciated by referring to the following detailed description and claims taken in conjunction with the accompanying drawings.

BRIEF DESCRIPTION OF THE DRAWINGS

FIG. 3A is a top perspective view of one embodiment of an alignment plate for an alignment structure for use in a packaged device adapter assembly such as that shown in FIGS. 1–2 according to the present invention.

FIG. 5A is a top view of the alignment plate shown in FIG. 3A having a packaged device of near maximum perimeter being aligned thereby according to the present invention.

FIG. 5B is a top view of the alignment plate shown in FIG. 3A having a packaged device with a smaller perimeter than that shown in FIG. 5A being aligned thereby according to the present invention.

DETAILED DESCRIPTION OF THE EMBODIMENTS

Generally, packaged device adapter assemblies for use with packaged devices, e.g., high density devices, along with methods using such assemblies, shall be described herein. An illustrative packaged device adapter assembly 10 according to the present invention shall be described with reference to illustrative FIGS. 1–2. Various other illustrative embodiments of packaged device adapter assemblies according to the present invention, including features which may be included in combination with features or structure of the other assemblies as described herein, shall be described with reference to FIGS. 3–7.

One skilled in the art will recognize from the description herein, that the various illustrative embodiments described include some features or elements included in other illustrative embodiments and/or exclude other features. However, a packaged device adapter assembly according to the present invention may include any combination of elements selected from one or more of the various embodiments as described herein with reference to FIGS. 1–7. For example, as will be readily apparent from the description below, a cover structure as shown in FIGS. 7A–7B may be used with one or more of the various adapter assembly embodiments described with reference to FIGS. 1–2, FIG. 6, etc. Further, for example, the alignment structure as described herein may be use in combination with any other embodiments of adapter assemblies described herein, and also other adapter assemblies that may benefit from the features thereof (e.g., those adapter assemblies that may not be described herein).

Figure 1:
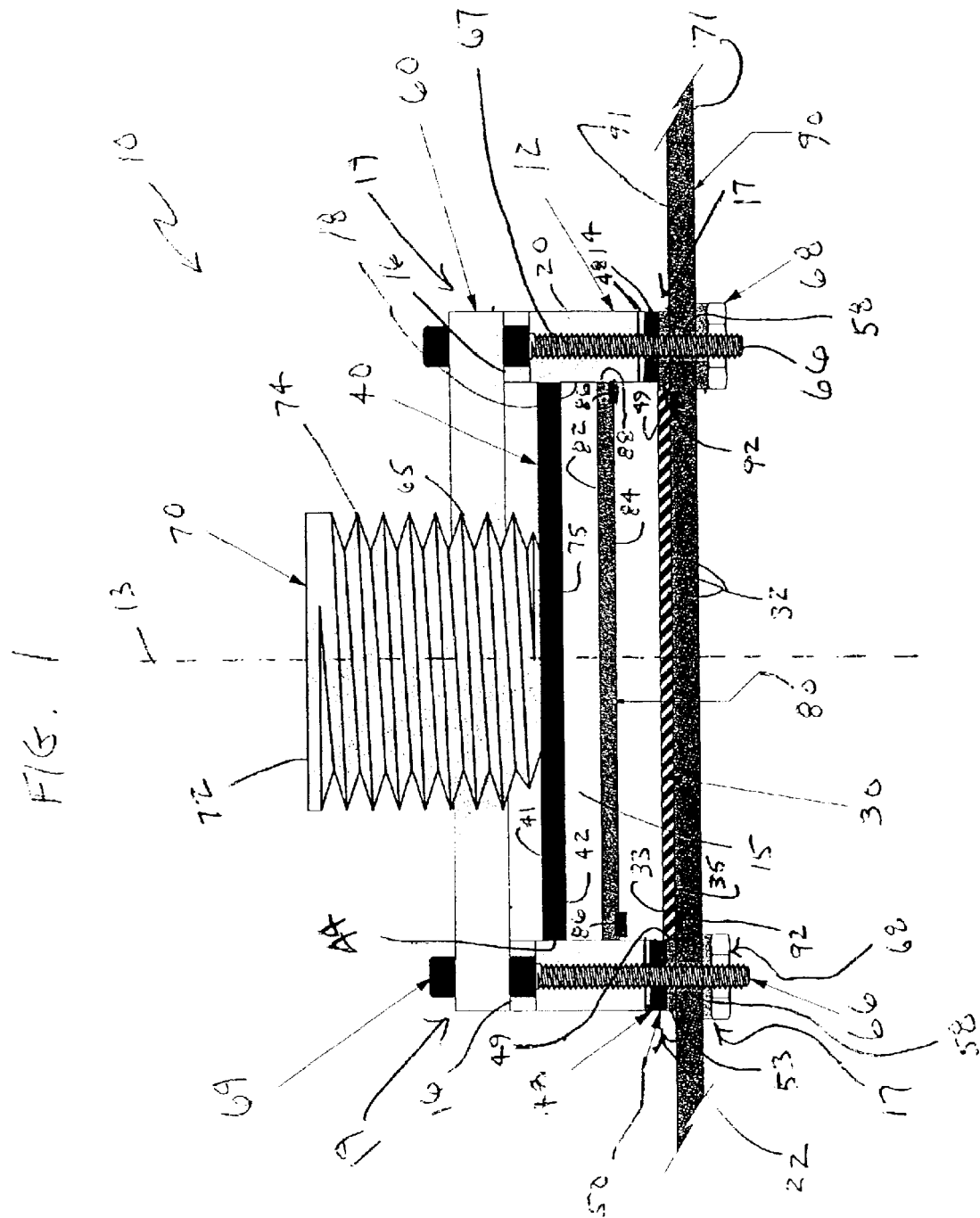
FIG. 1 is a cross-section side view of a packaged device adapter assembly according to the present invention mounted on a target board.
Figure 2:
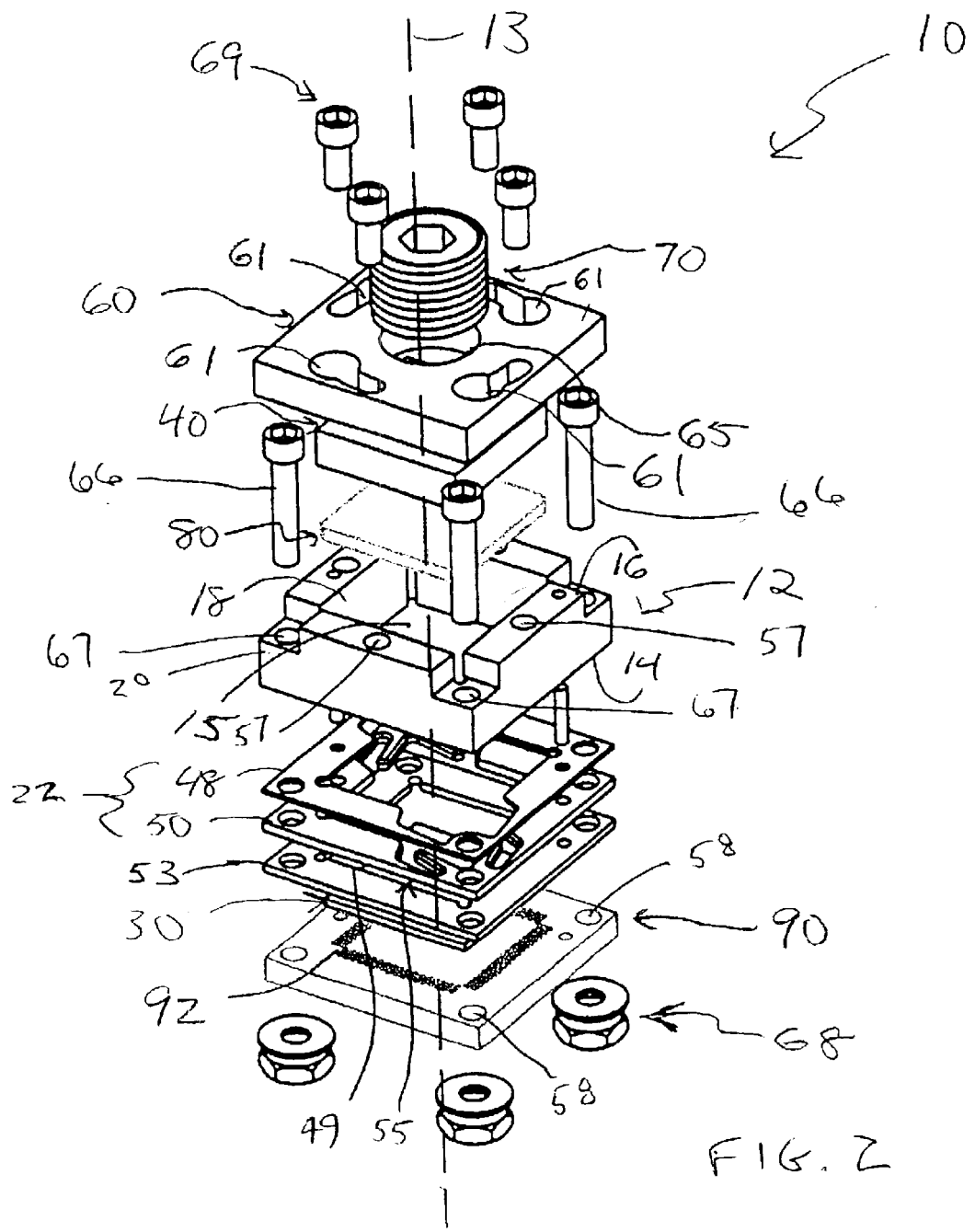
FIG. 2 is a top exploded perspective view of the packaged device adapter assembly of FIG. 1.

FIGS. 1–2 show a cross-section side view and a top exploded perspective view, respectively, of an illustrative packaged device adapter assembly 10 for use with a packaged device 80 according to the present invention. Generally, the packaged device adapter assembly 10 is for mounting on a target board 90. The packaged device adapter assembly 10 includes a perimeter wall member 12 having a length along an adapter axis 13. Generally, the length of the perimeter wall member 12 extends between a first end 14 of the perimeter wall member 12 at a first end region 17 of the packaged device adapter assembly 10 to a second end 16 of the perimeter wall member 12 at a second end region 19 of the packaged device adapter assembly 10. The perimeter wall member 12 includes an inner surface 18 facing towards the adapter axis 13 and an opposing outer surface 20 facing away from the adapter axis 13.

The packaged device adapter assembly 10 further includes a conductive element layer 30 including a plurality of arranged conductive elements 32 therein, e.g., a conductive elastomer layer. The perimeter wall member 12 and the conductive element layer 30 including the plurality of arranged conductive elements 32 generally define a socket cavity 15 sized for receiving a packaged device 80 that is aligned using an alignment structure 22 positioned at the first end region 17 of the packaged device adapter assembly 10 as will be described in further detail herein.

Generally, the packaged device 80 includes an upper surface 82 and a lower surface 84 in addition to one or more side surfaces 88 extending therebetween at the perimeter of the packaged device 80. A plurality of contact elements 86 are disposed at least at the lower surface 84. For example, the contact elements 86 may be distributed in an array along x and y axes orthogonal to the adapter axis 13 or the contact elements (e.g., lands) may be distributed along the outer portions of the lower surface 84 proximate the perimeter thereof. However, any arrangement of contact elements 86 may be accommodated according to the present invention.

The packaged device 80 may be any packaged device having a plurality of contact elements 86 disposed on a surface thereof. Preferably, the packaged device is a device having a high density of contact terminals, e.g., lands, solder spheres, bumps, contact pads, leads, etc., disposed on a surface thereof. For example, the high density packaged device may be a micro lead frame package, a micro lead chip carrier, a quad flat no lead package, a micro ball grid array package, or any other type of package such as a ball grid array package, a chip scale package, a flip chip package, a flat package, a quad flat package, a small outline package, a land grid array package, or any other package having contact elements disposed on a surface thereof. Although the present invention is described herein with reference to a micro lead frame package as illustrated in the figures, the present invention is in no manner limited to use of the illustrative adapter apparatus embodiments described herein with only such packages. Rather, the adapter assemblies and adapter concepts described herein may be used with any packaged device having contact elements disposed on a surface thereof.

Further, the packaged device adapter assembly 10 includes a cover member 60 positioned at the second end 16 of the perimeter wall member 12 to close the socket cavity 15. The cover member 60 is generally movable, e.g., removable via fastening devices 69 as shown in FIGS. 1–2. However, the cover member may also be moveable about a hinge axis (not shown), or any other manner of removing or moving the cover to open the socket cavity for allowing a packaged device to be received therein. In other words, one or more of the cover member configurations allow the packaged device 80 to be removed from the socket cavity 15 and another packaged device placed therein. The packaged device adapter assembly 10 is generally used to provide electrical contact between the contact elements 86 of the packaged device 80 and contact pads 92 of the target board 90 via the arranged conductive elements 32 of conductive element layer 30 when the packaged device 80 is positioned in the socket cavity 15.

The packaged device adapter assembly 10 further includes a floating member 40 as shown in FIGS. 1–2. The floating member 40 is used in combination with an actuator element 70 to provide a distributed force on the packaged device 80 when received in the socket cavity 15 such that the contact elements 86 disposed on the lower surface 84 of the packaged device 80 are in effective electrical contact with the arranged conductive elements 32 of the conductive element layer 30. As shown in FIG. 1, the floating member 40 is shown spaced apart from the packaged device 80, as is the conductive element layer 30.

At least in one embodiment, the floating member 40 includes an upper surface 41 that is generally planar and orthogonal to the adapter axis 13 when the floating member 40 is positioned in the socket cavity 15. Further, at least in one embodiment, the floating member 40 includes a lower surface 42 that is configured as a function of the upper surface 82 of the packaged device 80. For example, as shown in FIG. 1, lower surface 42 of the floating member 40 is generally planar and in direct contact with the planar upper surface 82 of a packaged device 80. However, the lower surface of the floating member 40 may be configured in any manner and need not be planar. Further, the floating member may be formed of any number of different components. However, at least a portion of the lower surface 42 of the floating member 40 is in direct contact with the upper surface 82 of the packaged device 80. The floating member 40 as shown in FIG. 1, includes an edge surface 44 extending between the upper surface 41 and the lower surface 42 at the perimeter of the floating member 40. The edge surface 44 lies adjacent, and may even be in contact with, the perimeter member wall 12 and is moveable relative thereto within the socket cavity 15.

The actuator element 70 may be any actuator element operable to apply a force on the upper surface 41 of the floating member 40. As a force is applied by the actuator element 70 to the upper surface 41 of the floating member 40, the force is distributed generally equally along the upper surface 82 of the packaged device 80. As such, an equivalent force is provided at each contact element 86, e.g., land, for effective contact between each contact element 86 and one or more conductive elements 32, e.g., conductive strands of a conductive elastomer layer. Such a distributed force across the entire packaged device 80 reduces the potential application of excessive force on one part of the packaged device 80 versus another part thereof, e.g., the center versus the perimeter.

Generally, in one or more embodiments, the actuator element 70 is an element associated with the cover member 60. For example, the actuator element may be a spring element, a leaf spring, or any other flexible element capable of applying a force to the floating member 40 via the association with the cover member 60. Further, although not preferred, the cover member 60 itself may be used to apply a force to the floating member 40 such as by tightening the cover member directly down on the floating member 40 by fastening elements, e.g., screws.

At least in one embodiment as shown in FIG. 1, the actuator element 70 is a threaded element that includes an upper region 72 with a threaded portion 74 extending therefrom. Further, in such an embodiment, the cover member 60 includes a threaded insert 65 positionable along the axis 13 of the adapter assembly 10 for mating with the threaded portion 74 of the actuator element 70. The threaded portion 74 terminates in a generally planer surface 75.

With the packaged device 80 in the socket cavity 15, the planer surface 75 is placed in direct contact with the upper surface 41 of the floating member 40 by turning the actuator element 70. As such, the actuator element 70 is adjustable to provide an effective force to the upper surface 41 of floating member 40 such that the distributed force is applied for effective electrical coupling of the contact elements 86 to the arranged conductive elements 32 of conductive element layer 30. With use of the actuator element 70 and the floating member 40, a suitable distributed force on the packaged device 80 can be achieved. The minimized load applied to the packaged device 80 and thus to the conductive elements 32 of the conductive element layer 30 allows for operation of the adapter assembly 10 over many insertion cycles as the conductive element layer 30 is not unnecessarily damaged by the force applied to the packaged device 80 in order to achieve contact between all of the contact elements 86 and the arranged conductive elements 32.

Preferably, the floating member 40 is formed of a heat conductive material, e.g., aluminum, to provide heat sinking capability. Further, actuator element 70 and the perimeter wall member 12 and cover 60 are formed of such heat sinking material. In such a manner, the elements that form the socket cavity 15 which provide electrical coupling of the packaged device 80 to a target board 90 also function to dissipate heat away from the packaged device 80 when the packaged device 80 is operable. This is particularly important for high density packaged devices in that such packaged devices tend to operate with greater heat output.

As can be seen from FIG. 1, the floating member 40 is sized and configured such that edge 44 thereof is in moveable contact with inner surface 18 of the perimeter wall member 12 which allows heat conduction therethrough and away from the packaged device 80. Likewise, the contact between the actuator element 70 and the floating member 40, such as provided by a screw formed of aluminum, allows for heat conduction from the threaded portion 74 (which is in direct contact with the floating member 40) to the exterior of the socket cavity 15.

It will be recognized that various elements or portions of the adapter assembly 10 may be formed of multiple layers or components or as single piece elements. For example, it will be recognized that the perimeter wall member 12 may be formed of multiple pieces or it may be formed as a single piece element. Further, for example, the floating member 40 may be formed of one or more layers or components.

The adapter assemblies as described herein may be mounted relative to various target boards as illustrated generally in FIG. 1 by target board 90 and may be mounted to the target board 90 in any number of different manners, many of which would be readily perceived by one skilled in the art. For example, such mounting may be performed as described in U.S. Pat. No. 6,394,820 issued 28 May 2002, entitled "PACKAGED DEVICE ADAPTER ASSEMBLY AND MOUNTING APPARTUS," which is incorporated herein by reference.

The target board 90 may be any substrate including contact pads arranged thereon for electrical connection with the adapter assembly 10. For example, the target board may be a printed circuit board including various other components mounted thereon or may be a surface mountable substrate (e.g., an interconnect board) as shown and described with reference to FIG. 6. This is particularly useful when the adapter assembly 10 is to be used with printed circuit boards that do not have mounting holes therein or when it is undesirable to provide mounting holes in the target board 90.

Figure 6:
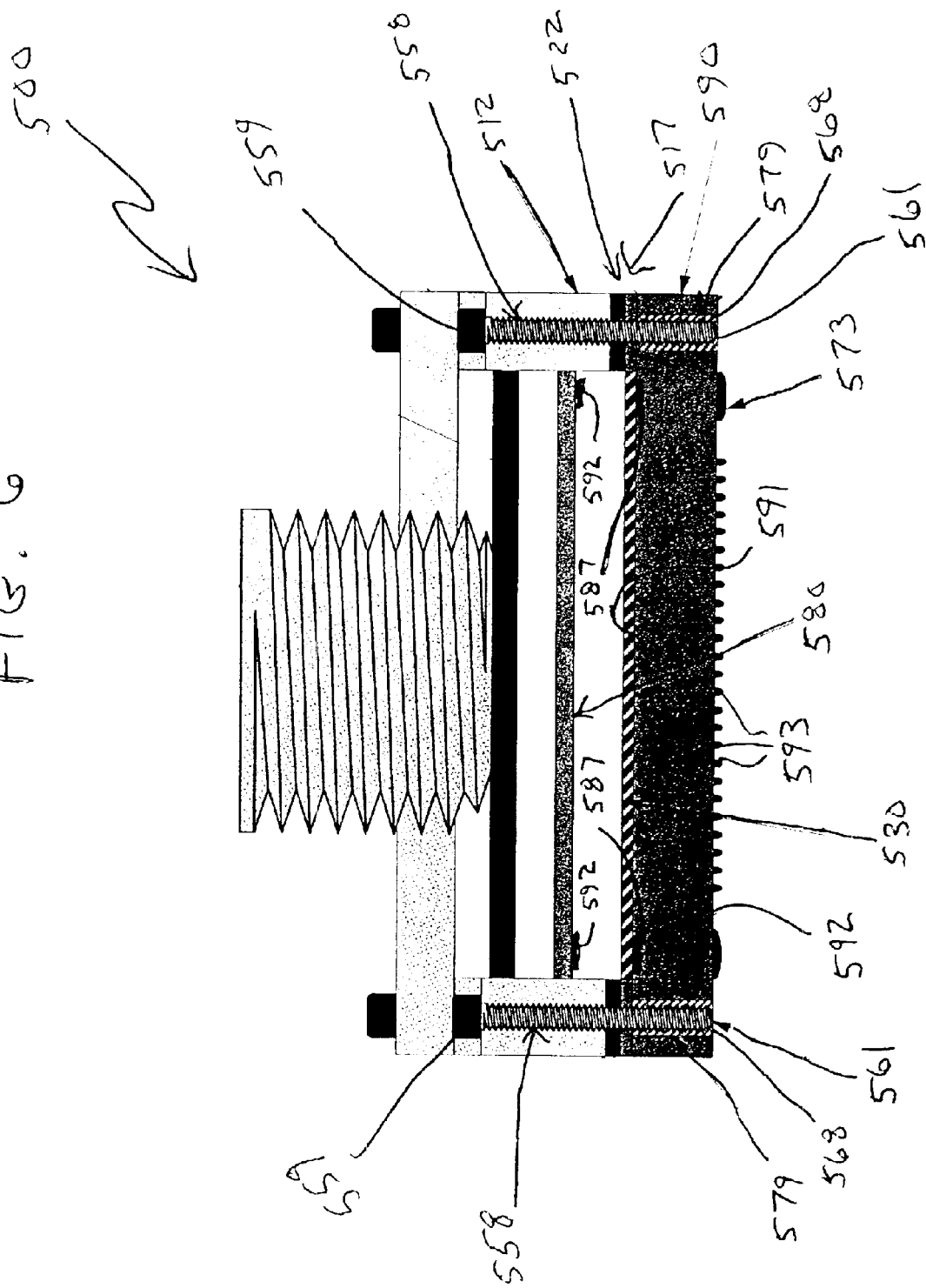
FIG. 6 is a cross-section side view of an alternate packaged device adapter assembly according to the present invention coupled to an interconnect board; the interconnect board being mountable (e.g., surface mountable) to a printed circuit board.
Figure 7A:
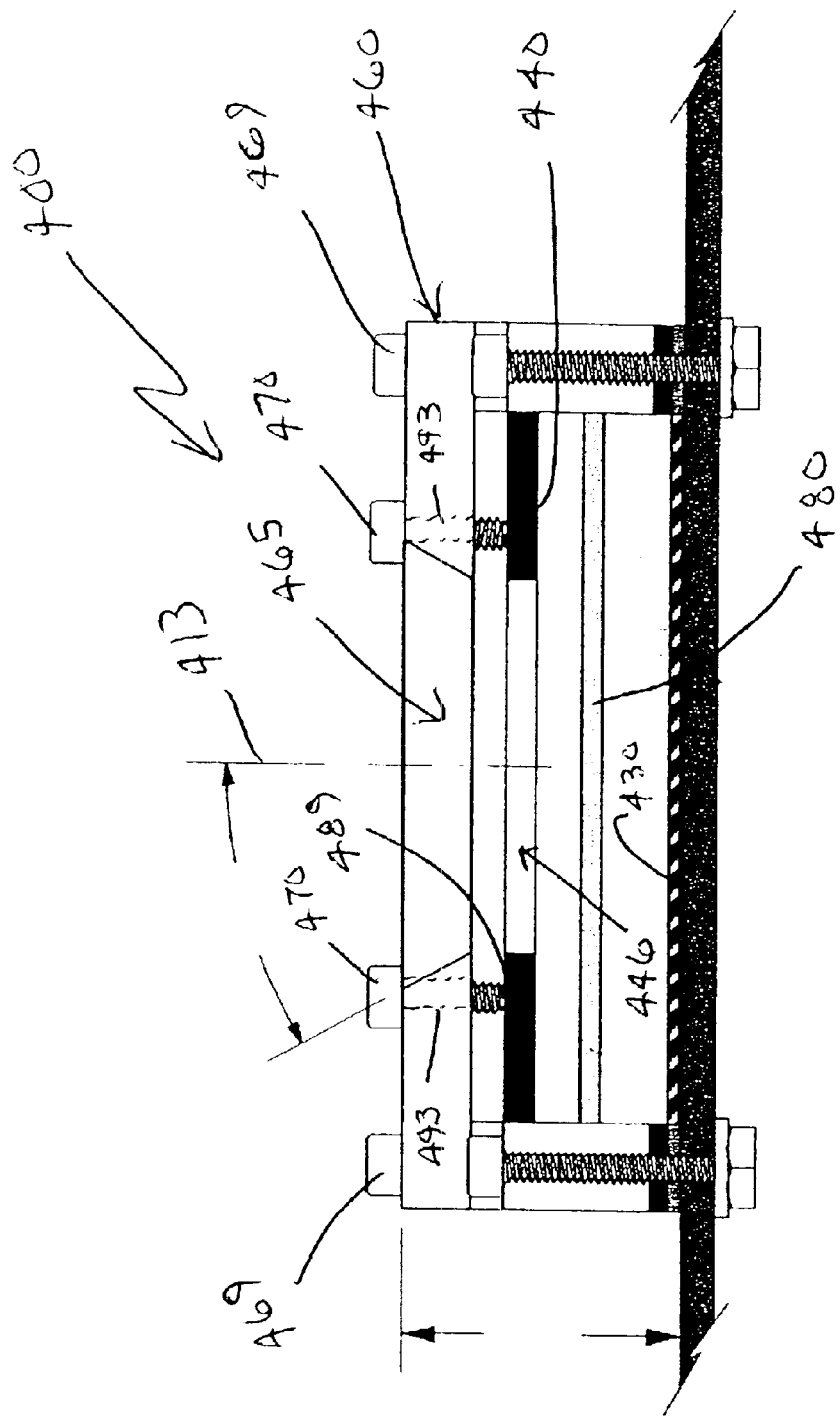
FIG. 7A is a cross-section side view of yet another alternate embodiment of a packaged device adapter assembly similar to that shown in FIGS. 1–2 including a particular cover structure according to the present invention.
Figure 7B:
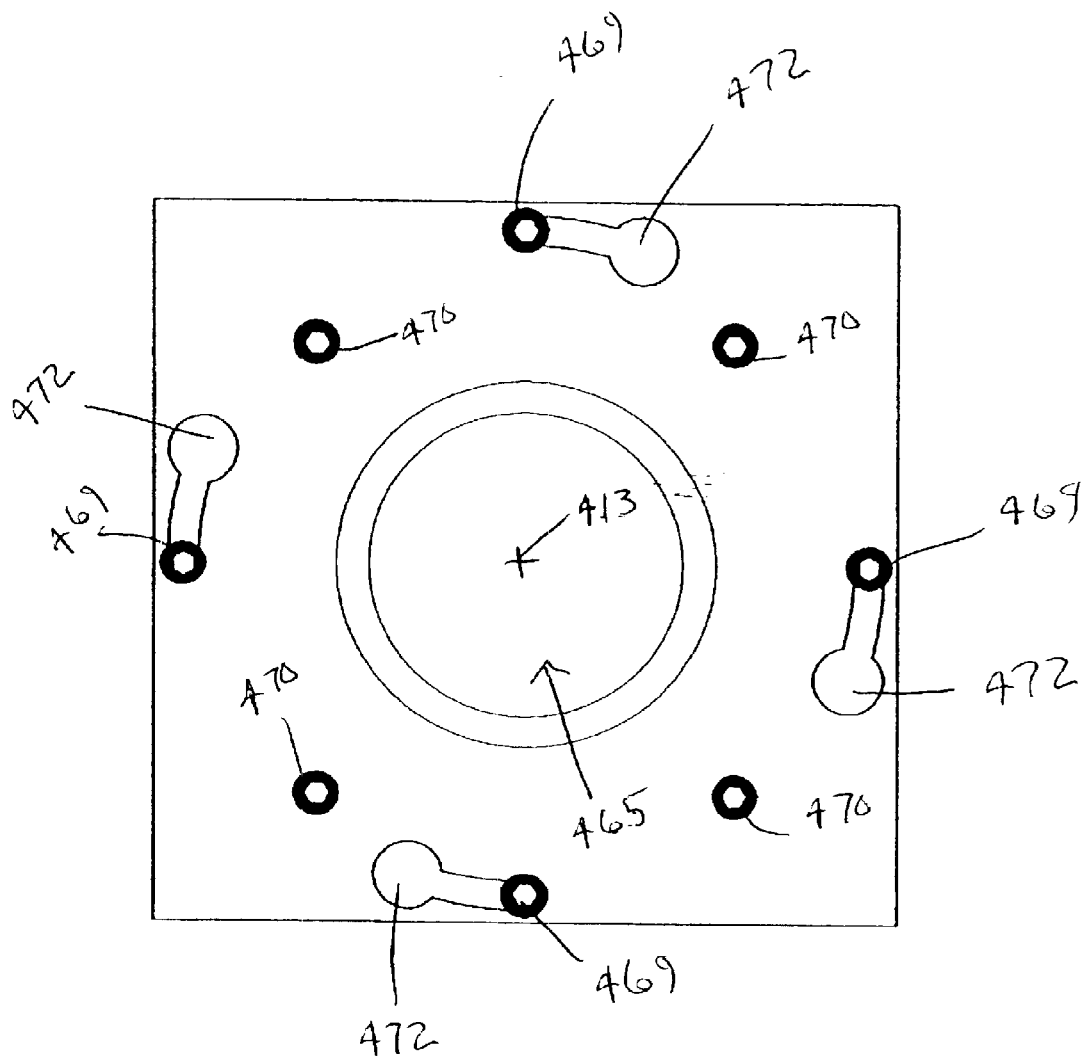
FIG. 7B shows a top view of the packaged device adapter assembly shown in FIG. 7A.

As shown in FIG. 6, an interconnect board 590 (e.g., an adapter board) includes an upper surface 591 having a plurality of contact pads 587 disposed thereon for electrical contact with conductive elastomer layer 530. A plurality of surface mountable solder spheres 593 are disposed on lower surface 592, e.g., arranged in an array, of the interconnect board 590. The contact pads 587 are electrically coupled to solder spheres 593 through use of conductive traces or any other conductive elements generally used to provide electrical contact between conductive elements disposed on opposing surfaces of a substrate. Further, for example, the interconnect board 590 may be formed of FR4 material and printed with conductive traces as performed using conventional printed circuit board fabrication techniques. In addition, solder spheres may be positioned on the upper surface 591 as described in U.S. Pat. No. 6,394,820, which is incorporated herein by reference.

As shown in FIG. 6, the adapter assembly 500 is mounted to interconnect board 590 in a manner unlike that shown in FIG. 1. As shown in FIG. 6, interconnect board 590 includes a plurality of openings 579 defined therein for receiving fastening devices 561, e.g., screws. The openings 579 are provided with inserts 568, e.g., threaded inserts, for mating with fastening devices 561. The perimeter wall member 512 has openings 558 defined therein to accept the threaded fastening devices 561 having heads 559 for engaging a portion of the perimeter wall member 512 upon insertion of the fastening devices 561 through the openings 558 and threaded inserts 568. In other words, in this embodiment, the interconnect board 590 is mounted adjacent the first end region 517 of the adapter assembly 500 by insertion of fastening elements 561 through openings 558 defined in perimeter wall member 512 and coupled with threaded inserts 568 within the interconnect board 590.

With interconnect board 590 mounted adjacent the adapter assembly 500, the interconnect board 590 may be mounted on a target board (e.g., a printed circuit board) having a contact pad pattern corresponding to the arrangement of solder spheres 593. As such, contact elements 592 of packaged device 580 can be electrically coupled to the target board (not shown) via the conductive elastomer layer 530 and interconnect board 590 using the adapter assembly 500. The larger solder spheres 573 are used for at least providing physical balance when mounting the interconnect board.

With further reference to FIG. 1, the adapter assembly 10 is mounted relative to target board 90 (e.g., a printed circuit board) in yet another manner using fastening devices (e.g., a threaded bolt 66 and washer/nut 68). Target board 90 includes openings 58 defined therein for use in attachment of the adapter assembly 10 to the target board 90 using the fastening devices. The threaded bolts 66 extend through openings 67 defined in perimeter wall member 12 and which further extend through openings 58 and beyond the lower surface 71 of the target board 90. A mating device, e.g., washer/nut 68, may then be coupled to the threaded bolts 66 which can be tightened to hold the assembly 10 in position relative to the target board 90.

It will be recognized that the adapter assemblies as described herein may be mounted relative to various configurations of target boards, including but clearly not limited to those described herein (e.g., a surface mountable board, a printed circuit board, etc.). Further, such mounting of the adapter assemblies relative to such target boards may be accomplished in any manner, including but clearly not limited to those described herein (e.g., adhesive, fastening devices including bolts and nuts, threaded inserts, etc.).

The adapter assembly 10, as more clearly shown in the exploded view of FIG. 2, is formed in a substantially square configuration. However, one skilled in the art will recognize that the elements used in forming the packaged device adapter assembly 10 may include elements for forming an adapter assembly configured as a rectangle, a circle, or any other configuration sized to accommodate a packaged device received in a socket cavity therein. As such, one skilled in the art will recognize that the present invention is not limited to any particular shape of adapter assembly, or alignment structure as described further herein, but is limited only as described in the appended claims.

As previously mentioned, the cover member 60 of the packaged device adapter assembly 10 may be configured in various manners. The cover member 60 is used to close the socket cavity 15 and includes various other elements associated therewith for facilitating other functionality. For example, as previously described herein, in one embodiment as shown in FIG. 1, cover member 60 is integrated with threaded insert 65 for receiving the threaded portion 74 of the actuator element 70 (e.g., a compression screw) used in applying a direct force to floating member 40. Further, cover member 60 as shown in FIG. 1 includes openings 61 for receiving corresponding fastening elements 69, e.g., screws or threaded bolts, to affix cover member 60 to the perimeter wall member 12. In such an embodiment, the perimeter wall member 12 includes inserts 57 for receiving the fastening elements 69 therein. For example, as shown in FIG. 1, inserts 57 may be threaded inserts for retaining threaded screw portions of screws 69 to attach cover member 60 to the perimeter wall member 12.

However, in another embodiment, the cover member 60 may also be configured as a latchable hinge cover as shown and described in U.S. Pat. No. 6,394,820, e.g., a ZIF type or clam-type lid. Although several cover members are described herein, the present invention is not limited to only such configurations as various other configurations may provide suitable closure function for the adapter.

In addition, the cover member 60 may also be configured as shown in FIGS. 7A–7B. FIGS. 7A–7B show a cross-section side view of a packaged device adapter assembly 400 which includes a perimeter wall member 412 and a conductive element layer 430 to form a socket cavity for receiving a packaged device 480 in a manner similar to that as shown in FIG. 1. The cover member 460 includes key slot holes 472 for easy locking and unlocking with mating oval head screws 469 in the same manner as shown in FIG. 2 (e.g., slots 61 and oval head screws 69). However, instead of an actuator element like that of threaded element 74 with mating insert 65 as shown in FIG. 1, an opening 465 is provided through the cover member 460 about axis 413. To provide the actuation function for providing a force on floating member 440, a plurality of actuator elements in the form of, for example, oval headed screws 470 having flat terminating ends 489 are used. In other words, threaded inserts 493 are provided in the cover member 460 for receiving the screws 470, allowing them to contact the floating member 440, and apply an appropriate force thereon. Any number and size of such actuators elements may be used such that the distributed force therefrom is effectively provided to the packaged device 480.

As further shown in FIG. 7A, the floating member 440 is also provided with an opening 446 about the axis 413. With the openings 465, 446 provided in the cover member 460 and the floating member 440, respectively, access to the packaged device 480 is possible. For example, a test probe may be used through the opening and/or heat may be allowed to escape through the opening.

Further with reference to FIGS. 1–2, the conductive element layer 30 includes an upper surface 33 and a lower surface 35. The arranged conductive elements 32 extend from the upper surface 33 to the lower surface 35 through insulative material to provide isolated conductive paths therethrough. The upper surface 33 is configured to allow contact between the contact elements 86 of the packaged device 80 and the conductive elements 32 arranged therein and the lower surface 35 is configured to allow contact between the conductive elements 32 and the contact pads 92 of the target board 90.

The conductive element layer 30 including the arranged conductive elements 32 is preferably a conductive elastomer layer. For example, the conductive elastomer layer may be formed of a z-axis elastomer material or a slanted axis conductive elastomer material. For example, such material may be that as described in U.S. Pat. No. 4,923,739 to Jin et al., issued 8 May 1990 and entitled "Composite Electrical Interconnection Medium Comprising a Conductive Network, And Article, Assembly, and Method;" that as described in U.S. Pat. No. 4,754,546 to Lee et al., issued 5 Jul. 1988 and entitled "Electrical Connector for Surface Mounting and Method of Making Thereof;" that as described in U.S. Pat. No. 4,729,166 to Lee et al., issued 8 Mar. 1988 and entitled "Method of Fabricating Electrical Connector for Surface Mounting;" that as described in U.S. Pat. No. 4,668,957 to Spohr, issued 26 May 1987 and entitled "Amorphous Glass Matrix Containing Aligned Microscopically Thin Metal Conductors;" or may be any other conductive elastomer material such as that available from Shin-Etsu Polymer America Inc. (Union City, Calif.) under the trade designation GB-Matrix.

Although the conductive element layer 30 is preferably a conductive elastomer material having conductive elements or material arranged therein, various other layers which include arranged conductive elements 32 therein may also be used according to the present invention. For example, the arranged conductive elements 32 may include formed conductive element structures, stamped conductive elements structures, or any other conductive material for connecting contact elements 86 to contact pads 92 on target board 90, e.g., pins, springs, pogo pins, or fuzz buttons.

According to the present invention, the alignment structure 22 is provided to assist in aligning the packaged device 80 in the socket cavity 15. Such alignment is necessary for accomplishing suitable electrical contact between the contact elements 86 of the packaged device 80 and the contact pads 92 of the target board 90 through the conductive element layer 30 (e.g., precisely position the packaged device 80 over the contact pads 92 of target board 90).

Generally, the alignment structure 22 is positioned at the first end region 17 of the adapter assembly 10 to align the packaged device 80 within the socket cavity 15. The alignment structure 22 includes at least an alignment plate 50 positioned orthogonal to the adapter axis 13. Generally, the alignment plate 50 includes at least one opening defined therein adapted to allow the contact elements 86 of the packaged device 80 to be in electrical contact with the arranged conductive elements 32 of the conductive element layer 30. Further, the alignment plate 50 includes a plurality of movable elements configured to movably engage the one or more perimeter side surfaces 88 of the packaged device 80 when the packaged device 80 is positioned in the socket cavity 15 adjacent the conductive element layer 30.

In one embodiment, the plurality of movable elements include two sets of movable elements (e.g., moveable elements 120 as shown in FIG. 3A) configured in opposing relation to one another such that each of the two sets of movable elements are adapted to movably engage at least one of the one or more perimeter side surfaces 88 of the packaged device 80 when the packaged device 80 is received in the socket cavity 15 adjacent the conductive element layer 30. In other words, the plurality of movable elements (e.g., movable elements 120) are operable to provide opposing forces on the one or more perimeter side surfaces 88 of the packaged device 80.

The alignment structure 22 may also include a spacer structure 48 that is adapted to define a free space adjacent the plurality of movable elements (e.g., moveable elements 120 as shown in FIG. 3A) so as to allow the plurality of movable elements to move from a normal state when the packaged device 80 has not been received in the socket cavity 15 to a flex state when the packaged device 80 is positioned in the socket cavity 15 adjacent the conductive element layer 30. For example, the spacer structure 48 may be provided as an integral part of the alignment plate 50 (e.g., a portion of the alignment plate 50 corresponding to the perimeter wall member 12 that has a thickness in the direction of the adapter axis 13 that is greater than the remainder of the alignment plate 50 that extends inward toward the adapter axis 13). Further, for example, the spacer structure may be a separate plate such as that described herein with reference to FIG. 4. Although several spacer structures are described herein, any spacer structure that provides a void (e.g., an open space) directly above the plurality of movable elements that allows them to move from a normal state to a flex state can be used.

One embodiment of an illustrative alignment plate 50 that may be used in the adapter assembly 10 shown in FIG. 1 is described with reference to the top perspective view of FIG. 3A, the detail top and side view of a portion of a movable element of FIG. 3B, and the alignment illustrations of FIGS. 5A–5B. In this particular embodiment, the packaged device 80 being aligned with the alignment plate 50 is a micro lead frame package (i.e., a square package as best shown in the top view of the package type in FIGS. 5A and 5B). As previously described, the packaged device 80 includes an upper surface 82 and a lower surface 84. As further shown in FIGS. 5A–5B, the packaged device 80 further includes four perimeter side surfaces 88 extending therebetween at the perimeter of the packaged device 80 to define an outer perimeter of the packaged device. In other words, the packaged device 80 has two pairs of opposing corners 321, 323. At each corner 321, 323, two perimeter side surfaces 88 of the packaged device intersect (e.g., form 90 degree corners).

The alignment plate 50 includes an upper surface 122 and a lower surface 129. The upper surface 122, at least in one embodiment, is adjacent the spacer structure 48 of the alignment structure 22. The lower surface 129 is adjacent an alignment structure 53 for use in aligning the conductive element layer 30 of the adapter assembly 10.

The alignment plate 50 further includes a body portion 112 that includes one or more fixed inner perimeter surfaces 118 that extend between the upper and lower surfaces and define an opening 116 in which the packaged device 80 is received. The one or more fixed inner perimeter surfaces 118 generally define a maximum outer perimeter of the packaged device 80 to be received in the socket cavity 15.

As shown in FIG. 5A–5B, where the device package 80 is positioned within the opening 116 defined by the one or more fixed inner perimeter surfaces 118, the opening 116 is shaped to correspond to the packaged device 80. In other words, the opening 116 is configured in this embodiment as a square opening sized to accept a packaged device 80 having the largest dimensions 300, 301 possible for the type of packaged device, e.g., micro lead frame package. As such, the opening 116 shall be referred to as the maximum packaged device opening 116 because the dimensions of the opening substantially correspond to the maximum perimeter dimensions of a package type.

The body portion 112 of the alignment plate 50 corresponds to and is positioned adjacent the end 14 of the perimeter wall member 12 (e.g., may be spaced therefrom by spacer structure 48) at the first end region 17 of the adapter apparatus 10. The body portion 112 further includes openings 140 that are aligned with openings 67 of the perimeter wall member 12. The openings 140 are for allowing the fastening device 66 to be received therethrough. For example, the fastening device, e.g., threaded bolt 66, is inserted through openings in the perimeter wall member 12, the spacer structure 48, the alignment plate 50, and the alignment structure 53 for aligning the conductive element layer 30, prior to being inserted into the opening 58 of the target board 90 for use in mounting the adapter assembly 10 to the target board 90.

The alignment plate 50 further includes two pairs of movable elements 120 that extend from the body portion 112 of the alignment plate 50 in engaging regions 133 of the alignment plate 50. Each movable element 120 of each pair of movable elements 120 when in a normal state (i.e., when a packaged device 80 is not positioned in the opening 116) extends into the maximum packaged device opening 116. The two pairs of movable elements 120 are configured in opposing relation to one another such that each pair of the two pairs of movable elements 120 movably engage two perimeter side surfaces 88 that intersect at one of the two opposing corners 321 of the packaged device 80 when the packaged device 80 is received in the socket cavity 15 adjacent the conductive element layer 30 (e.g., the pairs of movable elements 120 provide equal and opposite forces on the packaged device 80 via the perimeter side surfaces 88 thereof moving the packaged device 80 into alignment).

Alignment plate 50 also includes extended openings 127 defined therein at corners of the alignment plate 50 where no movable elements 120 are present. Such openings 127 provide space in the alignment plate 50 so as to more easily receive the packaged device 80 in the opening 116.

The alignment plate 50, along with one or more of the other components described herein, may be provided in any number of ways. For example, such components may be molded, machined, stamped, otherwise formed by one or more known processes. Many of such components are formed of high temperature plastic.

Each pair of movable elements 120 are configured in a v-like shape including a first and second movable element 120 extending along an element axis 141. An intersection point of the axes 141 for a pair of movable elements 120 forms an angle 357 therebetween that is less than 90 degrees. In other words, the movable elements 120 of each pair are separated by a notch 126; the notch 126 generally has the shape of an isosceles triangle with each movable element 120 forming a leg thereof. The apex of the triangle formed by the intersection of the movable elements of the pair is of an angle less than 90 degrees.

Figure 3B:
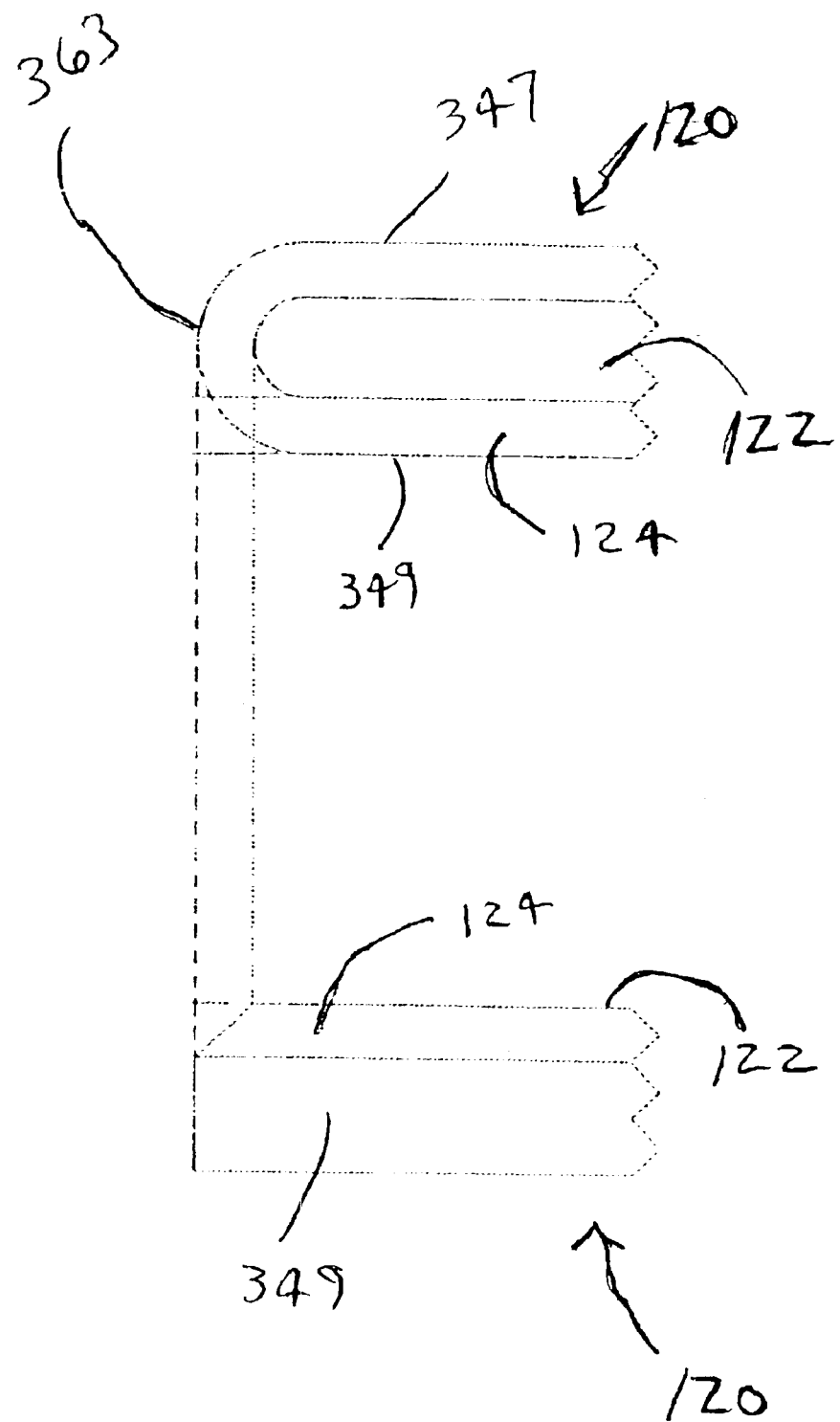
FIG. 3B is a top view and side view of a portion of the alignment plate shown in FIG. 3A.

As shown in FIGS. 3A and 3B, each movable element 120 extends from the body portion 112 and terminates at an end 363 with lies in the area defined by the maximum packaged device opening 116 when the movable elements are in the normal state (i.e., a packaged device is not in the opening 116). Each movable element 120 includes outer side surfaces 347 and inner side surfaces 349 (i.e., inner side surfaces that face the axis 13 of the adapter assembly) that extend between the lower surface 129 of the alignment plate 50 and upper surface 122 of the alignment plate. The inner side surfaces 349 facing the adapter axis 13 are adapted to engage the one or more perimeter side surfaces 88 of the packaged device 80 when the packaged device 80 is positioned in the socket cavity 15 adjacent the conductive element layer 30. The inner and outer side surfaces 349, 347 are generally faced in opposing directions.

Further, in each engaging region 133 and adjacent the outer side surfaces 347, openings such as slots 128 are defined. The slots 128 allow the movable elements 120 to have space for flexing outward and away from the axis 13 of the adapter assembly 10 when engaging the perimeter side surfaces 88 of the packaged device 80.

Further, as shown in FIG. 3B, at least in one embodiment, the edge 124 of each movable element 120 between the side surfaces 347, 349 and the upper surface 122 is beveled. As used herein, beveled refers to not only a chamfered edge at a particular angle but may also include an edge having a radius, along with any other edge modification that assists the alignment process as described herein. The beveled edge 124 assists in positioning the packaged device 80 in the opening 116 such that alignment is provided using the movable elements 120. For example, as the packaged device 80 is positioned in the cavity 15, an edge of the packaged device (e.g., edge between the perimeter side surfaces 88 and the lower surface 84 of the packaged device 80) contacts the beveled edge 124 and with a slight force on the packaged device 80 the edge of the packaged device 80 slides along the beveled edge 124 urging the moveable elements 120 of each pair of movable elements 120 apart (e.g., into the slots 128 and out of the maximum packaged device opening 116) such that the perimeter side surfaces 88 of the packaged device 80 can engage with the inner side surfaces 349 of the movable elements 120. The movable elements 120 provide forces on the packaged device 80 inward toward the axis 13 of the adapter assembly 10 so as to desirably align the packaged device in the opening 116.

The plurality of movable elements 120 are adapted to move from a normal state when a packaged device 80 has not been received in the socket cavity to a flex state when the packaged device 80 is positioned in the socket cavity 15 adjacent the conductive element layer 30. A position of the inner side surfaces 349 of the plurality of movable elements 120 (e.g., at the terminating end 363 of a movable element) is at a distance further from the adapter axis 13 when the plurality of movable elements 120 are in the flex state as compared to when the plurality of movable elements 120 are in the normal state.

At least in one embodiment, the plurality of movable elements 120 have a thickness in the direction of the adapter axis 13 that is less than a thickness of the packaged device 80. In this manner, the lower surface 42 of the floating member 40 when used to apply a force on the packaged device 80 as described herein does not contact the upper surface 122 of the movable elements 120. As such, there is no binding of the movable elements 120 when they extend into the maximum packaged device opening 116 such that they are free to apply alignment forces on the perimeter side surfaces 88 of the packaged device 80.

The movement of the movable elements 120 is shown further in FIGS. 5A–5B. FIG. 5A shows the alignment plate 50 being used to align a packaged device 80A with substantially maximum perimeter. FIG. 5B shows the alignment plate 50 being used to align a packaged device 80B of the same type having a perimeter that is less than the substantially maximum perimeter of packaged device 80A. As such, in FIG. 5B, a gap 360 exists between the perimeter side surfaces 88 of the packaged device 80B and one or more fixed inner perimeter surfaces 118 defining the maximum packaged device opening 116.

Generally, in operation, a packaged device 80 is aligned in the socket cavity 15 of the adapter assembly 10 using the alignment plate 50. A packaged device 80 is positioned in the socket cavity 15 such that the plurality of movable elements 120 are moved to the flex state (e.g., see FIG. 5A). A position of the inner side surfaces 349 of the plurality of movable elements are at a distance further from the axis 13 when the plurality of movable elements 120 are in the flex state as compared to when the plurality of movable elements are in the normal state (e.g., see FIG. 3A).

When positioning the packaged device 80 in the socket cavity 15, one or more edges of the packaged device 80 engage the beveled edge 124 of one or more of the plurality of movable elements 120 forcing the movable elements 120 from the normal state to the flex state. The plurality of movable elements 120 provide opposing forces on the one or more perimeter side surfaces 88 of the packaged device 80 when the packaged device 80 is positioned in the opening 116 to hold the packaged device 80 in an aligned position in the socket cavity 15. In other words, as the moveable elements 120 are moved into the flex state, the packaged device 80 snap fits into the opening 116.

One skilled in the art will recognize that various configurations of movable elements in the engaging regions 133 may be used to align the packaged device 80 in the adapter assembly 10. Such configurations need only provide for proper forces to be applied to the packaged device 80 when it is positioned in the opening 116 to align it therein. For example, the shape of the elements need not be elongated legs such as shown in FIG. 3A, but only need to have a shape and surrounding region (e.g., space to move) that allows the elements to move from a normal to a flex state when the packaged device 80 comes into contact with the movable elements 120. The movable elements may be formed as an integral part of the alignment plate 50 or may be elements coupled thereto (e.g., a flex element attached to the body portion surrounded by space to move from a normal state to a flex state).

As mentioned herein, at least in one embodiment, a spacer structure 48 is used in combination with the alignment plate 50 to prevent binding of the movable elements 120 by the perimeter wall member 12 of the adapter assembly 10. For example, as can be recognized by the configuration of the movable elements 120 in FIG. 3A, such movable elements 120 lie substantially under the perimeter wall member 12 when assembled therewith. Without a spacer structure 48, the movable elements 120 may be in contact with the end 14 of the perimeter wall member 12 which would prevent the movable elements 120 from effectively providing the forces on the packaged device 80 used to align the packaged device 80 in the opening 116. The spacer structure 48 prevents such binding from occurring and provides a void above the movable elements allowing them to move freely for providing alignment (e.g., the pairs of movable elements 120 provide equal and opposite forces on the packaged device 80 via the perimeter side surfaces 88 thereof).

Figure 4:
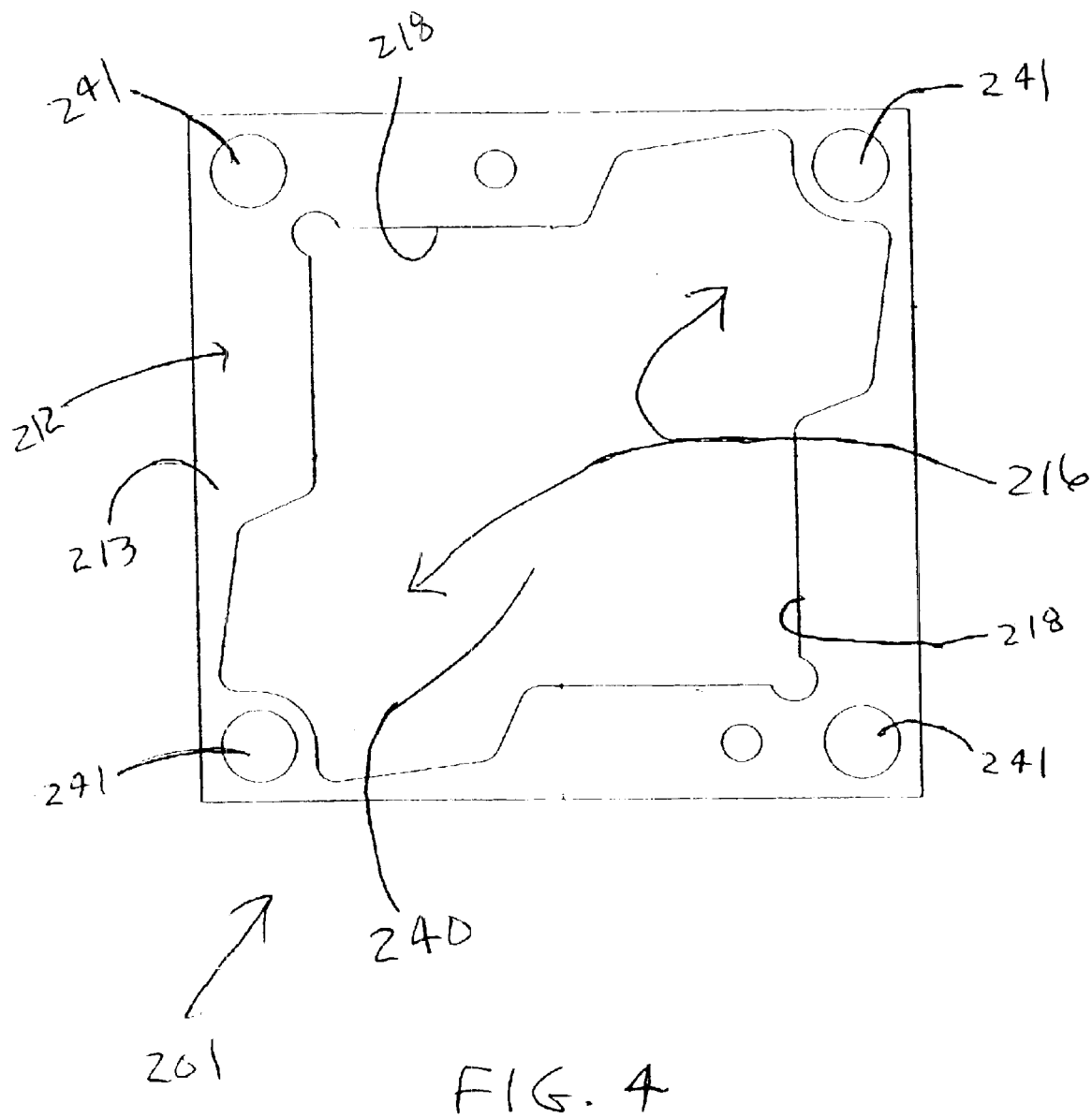
FIG. 4 is a top view of a spacer of an alignment structure for use in a packaged device adapter assembly such as that shown in FIGS. 1–2 and useable with an alignment plate such as that shown in FIGS. 3A–3B according to the present invention.

As described herein, the spacer structure 48 may be provided as a separate spacer plate 201 such as that illustrated in FIG. 4. Further, for example, the spacer structure may be incorporated into the body member 112 of the alignment plate. However, any spacer structure that provides for a void above the movable elements allowing them to flex freely is contemplated according to the present invention.

The spacer plate 201 illustrated in FIG. 4 incudes a body member 212 that generally corresponds to the perimeter wall member 12 of the adapter assembly 10. The thickness of the body member 212 is sufficient to provide the free space above the movable elements 120 when incorporated into the adapter assembly 10.

The spacer plate 201 includes an upper surface 213 and a lower surface (not shown). The upper surface 213, at least in one embodiment, is adjacent the end 14 of the perimeter wall member 12 of the adapter assembly 10. The lower surface is adjacent the upper surface 122 of the body portion 112 of the alignment plate 50. The body portion 212 of the spacer plate 201 includes one or more fixed inner perimeter surfaces 218 that extend between the upper and lower surfaces and define an opening 240 in which the packaged device 80 is received. The one or more fixed inner perimeter surfaces 218 are generally of the same configuration as the alignment plate 50. However, they need only provide a larger opening 240 than the maximum outer perimeter of the packaged device 80 to be received in the socket cavity 15.

The spacer plate 201 further includes openings 241 that are aligned with openings 67 of the perimeter wall member 12. The openings 241 are for allowing the fastening device 66 to be received therethrough. For example, the fastening device, e.g., threaded bolt 66, is inserted through openings in the perimeter wall member 12, the spacer structure 48, the alignment plate 50, and the alignment structure 53 for aligning the conductive element layer 30, prior to being inserted into the opening 68 of the target board 90 for use in mounting the adapter assembly 10 to the target board 90.

The spacer plate 201 further includes extended opening portions 216 in a position that generally corresponds to the engaging regions 133 of the alignment plate 50. Such extended opening portions 216 lie above the movable elements 120 of each pair of movable elements 120 when assembled with the alignment plate 50. As such, a void above the moveable elements 120 is provided to allow the movable elements to freely move from the normal sate to the flex state when necessary.

Further, although not shown, the same or slightly modified configuration of the spacer plate 201 described above may be incorporated into the alignment plate 50 to accomplish a similar function. For example, the body portion 112 of the alignment plate 50 corresponding to the perimeter wall member 12 may be increased in thickness in the direction of the adapter axis 13 to a thickness greater than the thickness of the plurality of movable elements 120. As such, when assembled, the adapter assembly 10 would have a void above the movable elements 120 to allow them to freely move from a normal sate to a flex state.

An alignment structure 53 for precise positioning of the conductive elements 33 of the conductive element layer 30 is also shown in FIG. 1. The alignment structure 53 lies generally parallel to the adapter axis 13 and corresponds generally to the perimeter wall member 12. In other words, the alignment structure 53 includes an inner perimeter surface 49 that defines an opening 55 in which the conductive element layer 30 (e.g., a conductive elastomer layer) is positioned. The surface 49 of the alignment structure 53 faces inward toward adapter axis 213 and contacts the conductive element layer 30 for alignment thereof.

The surface 49 that terminates the alignment structure 53 is adjacent the conductive element layer 30, e.g., a conductive elastomer layer, and may be in one embodiment generally parallel to the adapter axis 13 to accommodate a conductive elastomer layer that has z-axis conductive elements therein (not shown). In such a manner, the lands 86 of packaged device 80 are aligned to contact pads 92 of target board 90 through a desired number of z-axis conductive elements embedded in conductive elastomer layer 30.

The alignment structure 53 shown in FIG. 1 in adapter assembly 10 is provided to accommodate the use of a conductive elastomer layer 30 having slanted conductive elements 32 embedded therein. As shown in FIG. 1, the surface 49 that terminates the alignment structure 53 is adjacent the conductive elastomer layer 30 and is at an angle relative to the adapter axis 13. The angle is determined at least in part by the angle of the slanted conductive elements embedded in the conductive elastomer layer 30. In such a manner, the contact elements 82 (e.g., lands) disposed on a surface of packaged device 80 can be aligned with contact pads 92 of target board 90 through a desired number of angled conductive elements 32 embedded in conductive elastomer 30.

All patents and references cited herein are incorporated in their entirety as if each were incorporated separately. This invention has been described with reference to illustrative embodiments and is not meant to be construed in a limiting sense. As described previously, one skilled in the art will recognize that various other illustrative adapter assembly embodiments may be provided which utilize various combinations of the elements described herein, and/or described with reference to U.S. Pat. No. 6,394,820, which is incorporated herein by reference. Various modifications of the illustrative embodiments, as well as additional embodiments of the invention and combinations of various elements herein, will be apparent to persons skilled in the art upon reference to this description. It is therefore contemplated that the patented claims will cover any such modifications or embodiments that may fall within the scope of the present invention as defined by the accompanying claims.

What is claimed is:

1. An adapter apparatus for receiving a packaged device having a plurality of contact elements disposed on a surface thereof, wherein the packaged device further comprises one or more perimeter side surfaces defining an outer perimeter of the packaged device, the adapter apparatus comprising:

a perimeter wall member comprising a length along an adapter axis between a first end region of the adapter apparatus and a second end region of the adapter apparatus;

a conductive element layer comprising a plurality of arranged conductive elements, wherein the conductive element layer is positioned at the first end region of the adapter apparatus orthogonal to the adapter axis, and further wherein the perimeter wall member and the conductive element layer define a socket cavity adapted to receive the packaged device with the plurality of contact elements thereof adjacent the conductive element layer; and an alignment structure positioned at the first end region to align the packaged device within the socket cavity, wherein the alignment structure comprises an alignment plate positioned orthogonal to the adapter axis, wherein the alignment plate comprises at least one opening defined therein adapted to allow the contact elements of the packaged device to be in electrical contact with the arranged conductive elements of the conductive element layer, and further wherein the alignment plate comprises a plurality of movable elements configured to movably engage the one or more perimeter side surfaces of the packaged device when the packaged device is positioned in the socket cavity adjacent the conductive element layer, wherein the plurality of movable elements comprise two pairs of movable elements configured in opposing relation to one another such that each pair of the two pairs of movable elements movably engage the one or more perimeter side surfaces of the packaged device when the packaged device is received in the socket cavity, wherein each movable element of each pair of movable elements extends along an element axis, and further wherein the element axes of each pair of movable elements lie at an angle less than 90 degrees relative to one another.

2. The adapter apparatus of claim 1, wherein the packaged device is a packaged device having at least two opposing corners, wherein two perimeter side surfaces of the packaged device intersect at each of the at least two opposing corners, wherein the two pairs of movable elements are configured in opposing relation to one another such that each pair of the two pairs of movable elements movably engage the two perimeter side surfaces that intersect at one of the two opposing corners when the packaged device is received in the socket cavity adjacent the conductive element layer.

3. The adapter apparatus of claim 1, wherein the plurality of movable elements comprise one or more surfaces adapted to engage the one or more perimeter side surfaces of the packaged device when the packaged device is positioned in the socket cavity adjacent the conductive element layer, wherein the plurality of movable elements are adapted to move from a normal state when a packaged device has not been received in the socket cavity to a flex state when die packaged device is positioned in the socket cavity adjacent the conductive element layer, wherein the position of the one or more surfaces of the plurality of movable elements are at a distance further from the adapter axis when the plurality of movable elements are in the flex state as compared to when the plurality of movable elements are in the normal state.

4. The adapter apparatus of claim 1, wherein the plurality of movable elements have a thickness in the direction of the adapter axis that is less than a thickness of the packaged device.

5. The adapter apparatus of claim 1, wherein the packaged device comprises one of a micro lead frame package, a micro lead chip carrier, a quad flat no lead package, micro bail grid array, and a micro land grid array.

6. The adapter apparatus of claim 1, wherein one or more of the plurality of movable elements comprises a beveled edge at an upper surface thereof.

7. The adapter apparatus of claim 1, wherein the plurality of movable elements are operable to provide opposing forces on the one or more perimeter side surfaces of the packaged device.

8. The adapter apparatus of claim 1, wherein the adapter apparatus is coupled to an interconnect board such that the arranged conductive elements are electrically coupled to contact pads on a first side of the interconnect board, and further wherein the interconnect board comprises electrical connection elements for mounting the interconnect board relative to a target board.

9. The adapter apparatus of claim 1, wherein the alignment plate comprises a body portion comprising one or more fixed inner perimeter surfaces defining the at least one opening, wherein the one or more fixed inner perimeter surfaces define a maximum outer perimeter of the packaged device to be received in the socket cavity, wherein the body portion corresponds to and is positioned adjacent an end of the perimeter wall member at the first end region of the adapter apparatus, wherein each of the plurality of movable elements extend along its respective element axis from the body portion of the alignment plate.

10. The adapter apparatus of claim 9, wherein the alignment structure further comprises a spacer structure that is adapted to define a free space adjacent the plurality of movable elements so as to allow the plurality of movable elements to move from a normal state when the packaged device has not been received in the socket cavity to a flex state when the packaged device is positioned in the socket cavity adjacent the conductive element layer.

11. The adapter apparatus of claim 10, wherein the spacer structure comprises the body portion, wherein the body portion corresponding to the perimeter wall member has a thickness in the direction of the adapter axis that is greater than the thickness of the plurality of movable elements in the direction of the adapter axis.

12. The adapter apparatus of claim 10, wherein the spacer structure comprises a spacer plate corresponding to the body portion of the alignment plate and positioned adjacent thereto, wherein the spacer plate when positioned adjacent the alignment plate is void of material in a space directly above the plurality of movable elements.

13. The adapter apparatus of claim 1, wherein the conductive element layer comprises a conductive elastomer layer.

14. The adapter apparatus of claim 13, wherein the conductive elastomer layer comprises conductive elements therein that are at an angle relative to the adapter axis, and further wherein the adapter apparatus comprises a conductive element layer alignment structure positioned at the first end region of the adapter apparatus comprising a surface facing the adapter axis that is at an angle relative to the adapter axis for use in positioning the angled conductive elements of the conductive elastomer layer.

15. The adapter apparatus of claim 1, wherein adapter apparatus further comprises:
an actuator apparatus comprising a floating member movable in the socket cavity and an actuator element, wherein the actuator element is operable to provide a force on the floating member such that a corresponding force is distributed to the packaged device when received in the socket cavity such that the plurality of contact elements are in electrical contact with the arranged conductive elements of the conductive element layer, and
a cover member positioned at the second end region of the adapter apparatus to close the socket cavity, wherein the cover member is movable to allow the packaged device to be removed from the socket cavity.

16. The adapter apparatus of claim 15, wherein at least one opening is defined in the cover member and the floating member to allow access to the packaged device when positioned in the socket cavity adjacent the conductive element layer.

17. An apparatus for use in an adapter configured to receive a packaged device having a plurality of contact elements disposed on a surface thereof, wherein the packaged device further comprises one or more perimeter side surfaces defining an outer perimeter of the packaged device, the apparatus comprising an alignment plate, wherein the alignment plaza comprises:
a body portion comprising one or more fixed inner perimeter surfaces defining an opening about an axis orthogonal to the alignment plate, wherein the one or more fixed inner perimeter surfaces define a maximum outer perimeter of the packaged device; and
a plurality of movable elements extending from the body portion of the alignment plate, wherein the plurality of movable elements are configured to movably engage the one or more perimeter side surfaces of the packaged device when the packaged device is positioned in the opening, wherein the plurality of movable elements comprise two pairs of movable elements configured in opposing relation to one another such that each pair of the two pairs of movable elements movably engage the one or more perimeter side surfaces of the packaged device when the packaged device is received in the socket cavity, wherein each movable element of each pair of movable elements extends from the body portion along an element axis, and further wherein the element axes of each pair of movable elements lie at an angle less than 90 degrees relative to one another.

18. The apparatus of claim 17, wherein the packaged device is a packaged device having at least two opposing corners, wherein two perimeter side surfaces of the packaged device intersect at each of the at least two opposing corners, wherein the two pairs of movable elements are configured in opposing relation to one another such that each pair of the two pairs of movable elements movably engage the two perimeter side surfaces that intersect at one of the two opposing corners when the packaged device is received in the opening.

19. The apparatus of claim 17, wherein the plurality of movable elements comprise one or more surfaces adapted to engage the one or more perimeter side surfaces of the packaged device when the packaged device is positioned in the opening, wherein the plurality of movable elements are adapted to move from a normal state when a packaged device has not been received in the opening to a flex state when the packaged device is positioned in the opening, wherein the position of the one or more surfaces of the plurality of movable elements are at a distance further from the axis when the plurality of movable elements are in the flex state as compared to when the plurality of movable elements are in the normal state.

20. The apparatus of claim 17, wherein the plurality of movable elements have a thickness in the direction of the axis that is less than a thickness of the packaged device.

21. The apparatus of claim 17, wherein the apparatus further comprises a spacer plate corresponding to the body portion of the alignment plate and positioned adjacent thereto, wherein the spacer plate when positioned adjacent the alignment plate is void of material in a space directly above the plurality of movable elements.

22. The apparatus of claim 17, wherein the body portion has a thickness in the direction of the adapter axis that is greater than the thickness of the plurality of movable elements in the direction of the adapter axis.

23. The apparatus of claim 17, wherein the packaged device comprises one of a micro lead frame package, a micro lead chip carrier, a quad flat no lead package, micro ball grid array, and a micro land grid array.

24. The apparatus of claim 17, wherein one or more of the plurality of movable elements comprises a beveled edge at an upper surface thereof.

25. The apparatus of claim 17, wherein the plurality of movable elements are operable to provide opposing forces on the one or more perimeter side surfaces of the packaged device when the packaged device is positioned in the opening.

26. A method of aligning a packaged device in an adapter apparatus, wherein the packaged device comprises a plurality of contact elements disposed on a surface thereof, wherein the packaged device further comprises one or more perimeter side surfaces defining an outer perimeter of the packaged device, wherein the method comprises:

providing an adapter apparatus defining a socket cavity for receiving the packaged device, wherein the adapter apparatus comprises an alignment plate, wherein the alignment plate comprises a body portion comprising one or more fixed inner perimeter surfaces defining an opening about an axis orthogonal to the alignment plate, and further wherein the alignment plate comprises a plurality of movable elements extending from the body portion of the alignment plate, wherein the plurality of movable elements comprise two pairs of movable elements configured in opposing relation to one another such that each pair of the two pairs of movable elements movably engage the one or more perimeter side surfaces of the packaged device when the packaged device is received in the socket cavity, wherein each movable element of each pair of movable elements extends along an element axis, and further wherein the element axes of each pair of movable elements lie at an angle less than 90 degrees relative to one another, wherein the plurality of movable elements are in a normal state when a packaged device has not been received in the opening; and positioning the packaged device in the socket cavity such that the plurality of movable elements are moved to a flex state, wherein a position of one or more surfaces of the plurality of movable elements are at a distance further from the axis when the plurality of movable elements are in the flex state as compared to when the plurality of movable elements are in the normal state.

27. The method of claim 26, wherein the packaged device comprises one of a micro lead frame package, a micro lead chip carrier, a quad flat no lead package, micro ball grid array, and a micro land grid array.

28. The method of claim 26, wherein one or more of the plurality of movable elements comprise a beveled edge at an upper surface thereof, wherein positioning the packaged device in the socket cavity comprises engaging one or more edges of the packaged device with the beveled edge of one or more of the plurality of movable elements forcing the movable elements from the normal state to the flex state.

29. The method of claim 26, wherein the method further comprises providing, with use of the plurality of movable elements, opposing forces on the one or more perimeter side surfaces of the packaged device when the packaged device is positioned in the opening to hold the packaged device in an aligned position in the socket cavity.

30. An adapter apparatus for receiving a packaged device having a plurality of contact elements disposed on a surface thereof, wherein the packaged device further comprises one or more perimeter side surfaces defining an outer perimeter of the packaged device, the adapter apparatus comprising:

a perimeter wall member comprising a length along an adapter axis between a first end region of the adapter apparatus and a second end region of the adapter apparatus;

a conductive element layer comprising a plurality of arranged conductive elements, wherein the conductive element layer is positioned at the first end region of the adapter apparatus orthogonal to the adapter axis, and further wherein the perimeter wall member and the conductive element layer define a socket cavity adapted to receive the packaged device with the plurality of contact elements thereof adjacent the conductive element layer; and an alignment structure positioned at the first end region to align the packaged device within the socket cavity, wherein the alignment structure comprises an alignment plate positioned orthogonal to the adapter axis, wherein the alignment plate comprises at least one opening defined therein adapted to allow the contact elements of the packaged device to be in electrical contact with the arranged conductive elements of the conductive element layer, wherein the alignment plate comprises a plurality of movable elements configured to movably engage the one or more perimeter side surfaces of the packaged device when the packaged device is positioned in the socket cavity adjacent the conductive element layer, wherein the alignment plate comprises a body portion comprising one or more fixed inner perimeter surfaces defining the at least one opening, wherein the one or more fixed inner perimeter surfaces define a maximum outer perimeter of the packaged device to be received in the socket cavity, wherein the body portion corresponds to and is positioned adjacent an end of the perimeter wall member at the first end region of the adapter apparatus, wherein the plurality of movable elements extend from the body portion of the alignment plate, and further wherein the alignment structure comprises a spacer structure that is adapted to define a free space adjacent the plurality of movable elements so as to allow the plurality of movable elements to move from a normal state when the packaged device has not been received in the socket cavity to a flex state when the packaged device is positioned in the socket cavity adjacent the conductive element layer.

31. The adapter apparatus of claim 30, wherein the plurality of movable elements comprise two sets of movable elements configured in opposing relation to one another such that each of the two sets of movable elements are adapted to movably engage at least one of the one or more perimeter side surfaces of the packaged device when the packaged device is received in the socket cavity adjacent the conductive element layer.

32. The adapter apparatus of claim 30, wherein the packaged device is a packaged device having at least two opposing corners, wherein two perimeter side surfaces of the packaged device intersect at each of the at least two opposing corners, wherein the plurality of movable elements comprise two pairs of movable elements configured in opposing relation to one another such that each pair of the two pairs of movable elements movably engage the two perimeter side surfaces that intersect at one of the two opposing corners when the packaged device is received in the socket cavity adjacent the conductive element layer.

33. The adapter apparatus of claim 30, wherein the plurality of movable elements comprise one or more surfaces adapted to engage the one or more perimeter side surfaces of the packaged device when the packaged device is positioned in the socket cavity adjacent the conductive element layer, wherein the plurality of movable elements are adapted to move from a normal state when a packaged device has not been received in the socket cavity to a flex state when the packaged device is positioned in the socket cavity adjacent the conductive element layer, wherein the position of the one or more surfaces of the plurality of movable elements are at a distance further from the adapter axis when the plurality of movable elements are in the flex state as compared to when the plurality of movable elements are in the normal state.

34. The adapter apparatus of claim 30, wherein the plurality of movable elements have a thickness in the direction of the adapter axis that is less than a thickness of the packaged device.

35. The adapter apparatus of claim 30, wherein the spacer structure comprise the body portion, wherein the body portion corresponding to the perimeter wall member has a thickness in the direction of the adapter axis that is greater than the thickness of the plurality of movable elements in the direction of the adapter axis.

36. The adapter apparatus of claim 30, wherein the spacer structure comprises a spacer plate corresponding to the body portion of the alignment plate and positioned adjacent thereto, wherein the spacer plate when positioned adjacent the alignment plate is void of material in a space directly above the plurality of movable elements.

37. The adapter apparatus of claim 30, wherein the packaged device comprising one of a micro lead frame package, a micro lead chip carrier, a quad flat no lead package, micro ball grid array, and a micro land grid array.

38. The adapter apparatus of claim 30, wherein one or more of the plurality of movable elements comprises a beveled edge at an upper surface thereof.

39. The apparatus of claim 30, wherein the conductive element layer comprises a conductive elastomer layer.

40. The adapter apparatus of claim 30, wherein adapter apparatus further comprises:
an actuator apparatus comprising a floating member movable in the socket cavity and an actuator element, wherein the actuator element is operable to provide a force on the floating member such that a corresponding force is distributed to the packaged device when received in the socket cavity such that the plurality of contact elements are in electrical contact with the arranged conductive elements of the conductive element layer; and
a cover member positioned at the second end region of the adapter apparatus to close the socket cavity, wherein the cover member is movable to allow the packaged device to be removed from the socket cavity.

41. The adapter apparatus of claim 30, wherein the adapter apparatus is coupled to an interconnect board such that the arranged conductive elements are electrically coupled to contact pads on a first side of the interconnect board, and further wherein the interconnect board comprises electrical connection elements for mounting the interconnect board relative to a target board.

42. An apparatus for use in an adapter configured to receive a packaged device having a plurality of contact elements disposed on a surface thereof, wherein the packaged device further comprises one or more perimeter side surfaces defining an outer perimeter of the packaged device, the apparatus comprising an alignment plate, wherein the alignment plate comprises:
a body portion comprising one or more fixed inner perimeter surfaces defining an opening about an axis orthogonal to the alignment plate, wherein the one or more fixed inner perimeter surfaces define a maximum outer perimeter of the packaged device, and
a plurality of movable elements extending from the body portion of the alignment plate, wherein the plurality of movable elements are configured to movably engage the one or more perimeter side surfaces of the packaged device when the packaged device is positioned in the opening; and
further wherein the apparatus comprises a spacer plate corresponding to the body portion of the alignment plate and positioned adjacent thereto, wherein the spacer plate when positioned adjacent the alignment plate is void of material in a space directly above the plurality of movable elements, wherein the spacer plate is adapted to define a free space adjacent the plurality of movable elements so as to allow the plurality of movable elements to move from a normal state when the packaged device has not been received in the socket cavity to a flex state when the packaged device is positioned in the socket cavity adjacent the conductive element layer.

43. The apparatus of claim 42, wherein the plurality of movable elements comprise two sets of movable elements configured in opposing relation to one another such that each of the two sets of movable elements are adapted to movably engage at least one of the one or more perimeter side surfaces of the packaged device when the packaged device is received in the opening.

44. The apparatus of claim 42, wherein the packaged device is a packaged device having at least two opposing corners, wherein two perimeter side surfaces of the packaged device intersect at each of the at least two opposing corners, wherein the plurality of movable elements comprise two pairs of movable elements configured in opposing relation to one another such that each pair of the two pairs of movable elements movably engage the two perimeter side surfaces that intersect at one of the two opposing corners when the packaged device is received in the opening.

45. The apparatus of claim 42, wherein the plurality of movable elements have a thickness in the direction of the axis that is less than a thickness of the packaged device.

46. The apparatus of claim 42, wherein the body portion has a thickness in the direction of the adapter axis that is greater than the thickness of the plurality of movable elements in the direction of the adapter axis.

47. The apparatus of claim 42, wherein the packaged device comprises one of a micro lead frame package, a micro lead chip carrier, a quad flat no lead package, micro ball grid array, and a micro land grid array.

48. The apparatus of claim 42, wherein one or more of the plurality of movable elements comprises a beveled edge at an upper surface thereof.

49. A method of aligning a packaged device in an adapter apparatus, wherein the packaged device comprises a plurality of contact elements disposed on a surface thereof, wherein the packaged device further comprises one or more perimeter side surfaces defining an outer perimeter of the packaged device, wherein the method comprises:
providing an adapter apparatus defining a socket cavity for receiving the packaged device, wherein the adapter apparatus comprises an alignment plate, wherein the alignment plate comprises a body portion comprising one or more fixed inner perimeter surfaces defining an opening about an axis orthogonal to the alignment plate, and further wherein the alignment plate comprises a plurality of movable elements extending from the body portion of the alignment plate, wherein the plurality of movable elements are in a normal state when a packaged device has not been received in the opening, wherein the adapter apparatus further comprises a spacer structure corresponding to the body portion of the alignment plate and positioned adjacent thereto, wherein the spacer structure when positioned adjacent the alignment plate is void of material in a space directly above the plurality of movable elements; and positioning the packaged device in the socket cavity, wherein the spacer structure plate is adapted to define a free space adjacent the plurality of movable elements so as to allow the plurality of movable elements to move from the normal state to a flex state when the packaged device is positioned in the socket cavity adjacent the conductive element layer, wherein a position of one or more surfaces of the plurality of movable elements are at a distance further from the axis when the plurality of movable elements are in the flex state as compared to when the plurality of movable elements are in the normal state.

50. The method of claim 49, wherein the packaged device comprises one of a micro lead frame package, a micro lead chip carrier, a quad flat no lead package, micro ball grid array, and a micro land grid array.

51. The method of claim 49, wherein one or more of the plurality of movable elements comprise a beveled edge at an upper surface thereof, wherein positioning the packaged device in the socket cavity comprises engaging one or more edges of the packaged device with the beveled edge of one or more of the plurality of movable elements forcing the movable elements from the normal state to the flex state.

52. The method of claim 49, wherein the method further comprises providing, with use of the plurality of movable elements, opposing forces on the one or more perimeter side surfaces of the packaged device when the packaged device is positioned in the opening to hold the packaged device in an aligned position in the socket cavity.

* * * * *